(12) United States Patent
Kim

(10) Patent No.: US 7,848,132 B2
(45) Date of Patent: Dec. 7, 2010

(54) FRAM INCLUDING A TUNABLE GAIN AMP AS A LOCAL SENSE AMP

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 72 days.

(21) Appl. No.: 12/471,472

(22) Filed: May 26, 2009

(65) Prior Publication Data

US 2010/0097840 A1 Apr. 22, 2010

Related U.S. Application Data

(63) Continuation of application No. 12/253,997, filed on Oct. 19, 2008.

(51) Int. Cl.
*G11C 11/22* (2006.01)
(52) U.S. Cl. .................. 365/145; 365/189.15
(58) Field of Classification Search .................. 365/145, 365/189.15, 189.16, 189.09, 203, 205, 185.13, 365/185.14
See application file for complete search history.

(56) References Cited

U.S. PATENT DOCUMENTS

| | | | |
|---|---|---|---|
| 5,570,319 A * | 10/1996 | Santoro et al. | 365/230.03 |
| 6,061,266 A | 5/2000 | Tan | |
| 6,574,135 B1 | 6/2003 | Komatsuzaki | |
| 6,819,584 B2 | 11/2004 | Noh | |
| 7,088,605 B2 | 8/2006 | Lin | |
| 7,158,428 B2 * | 1/2007 | Fujimoto | 365/203 |
| 7,251,184 B2 * | 7/2007 | Nakaya et al. | 365/230.03 |
| 7,277,339 B2 * | 10/2007 | Edahiro | 365/203 |
| 7,382,641 B2 | 6/2008 | Kang et al. | |
| 7,411,810 B2 * | 8/2008 | Kim | 365/145 |
| 7,443,714 B1 * | 10/2008 | Kim | 365/149 |
| 2007/0183191 A1 * | 8/2007 | Kim | 365/175 |
| 2007/0211535 A1 * | 9/2007 | Kim | 365/185.21 |
| 2008/0025113 A1 * | 1/2008 | Kitagawa | 365/189.09 |
| 2008/0316839 A1 * | 12/2008 | Kajigaya | 365/189.11 |

* cited by examiner

*Primary Examiner*—Van Thu Nguyen
*Assistant Examiner*—Douglas King

(57) ABSTRACT

FRAM includes a tunable gain amp serving as a local sense amp, wherein the tunable gain amp is connected to a local bit line for reading a memory cell including a pass transistor and a ferroelectric capacitor, and gain is adjusted by setting a local amp voltage for reading the memory cell more effectively with optimized gain. And a global sense amp is connected to the local sense amp for receiving a read output. When reading data, a voltage difference in the local bit line is converted to a time difference by the sense amps for differentiating high data and low data. For example, high data is quickly transferred to an output latch circuit through the sense amps with high gain, but low data is rejected by a locking signal based on high data as a reference signal. Additionally, alternative circuits and memory cell structures for implementing the memory are described.

20 Claims, 13 Drawing Sheets

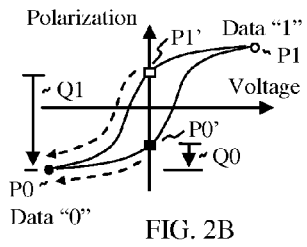
FIG. 2B
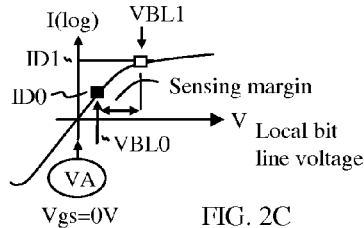
FIG. 2C
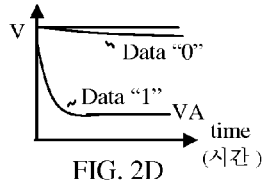
FIG. 2D
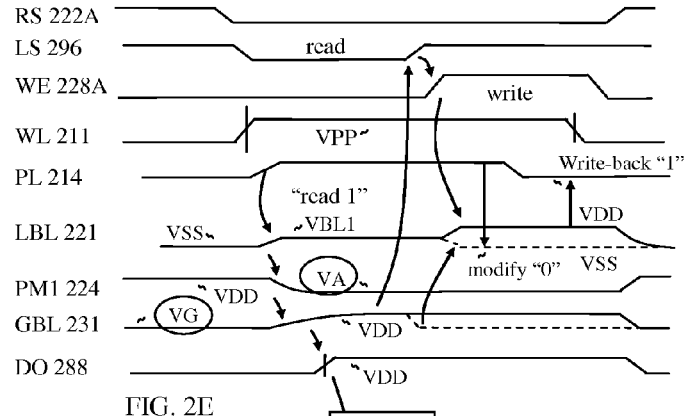
FIG. 2E
FIG. 2F
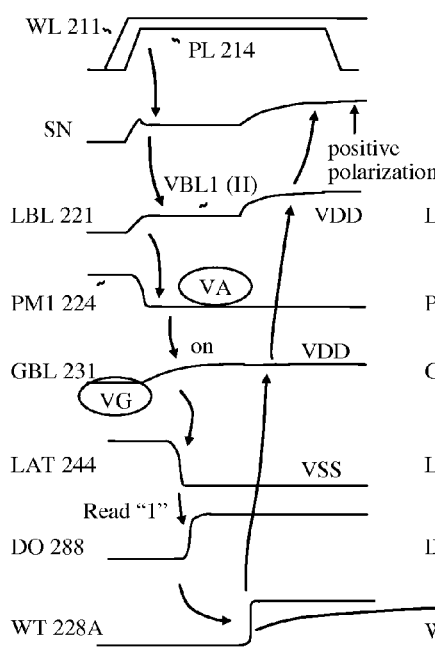
FIG. 2G
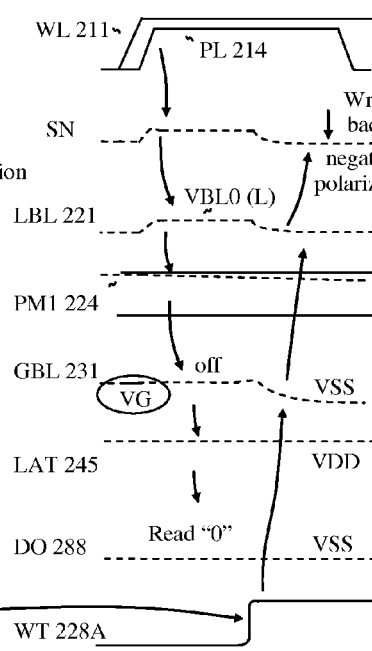
FIG. 2H
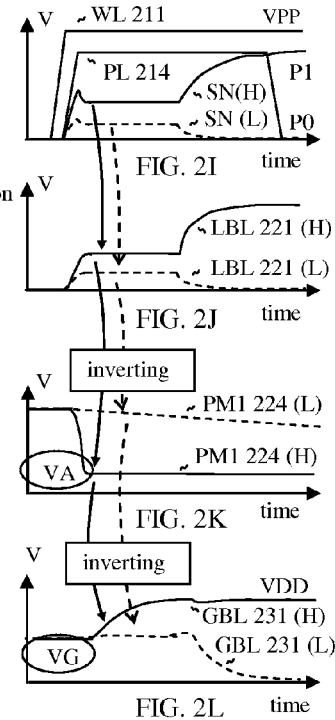
FIG. 2I
FIG. 2J
FIG. 2K
FIG. 2L

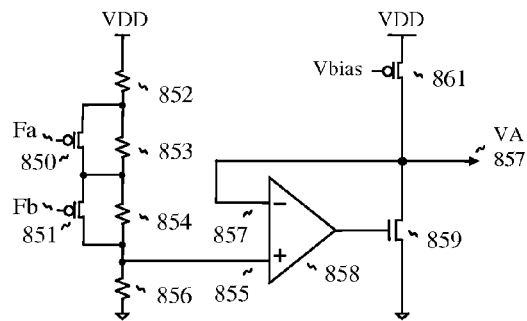
FIG. 8D
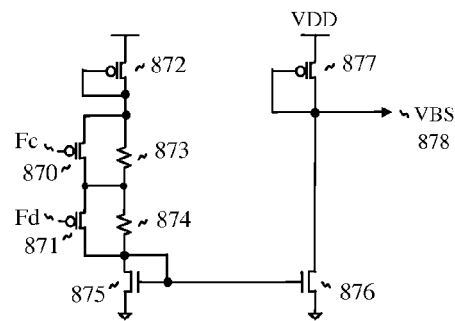
FIG. 8E
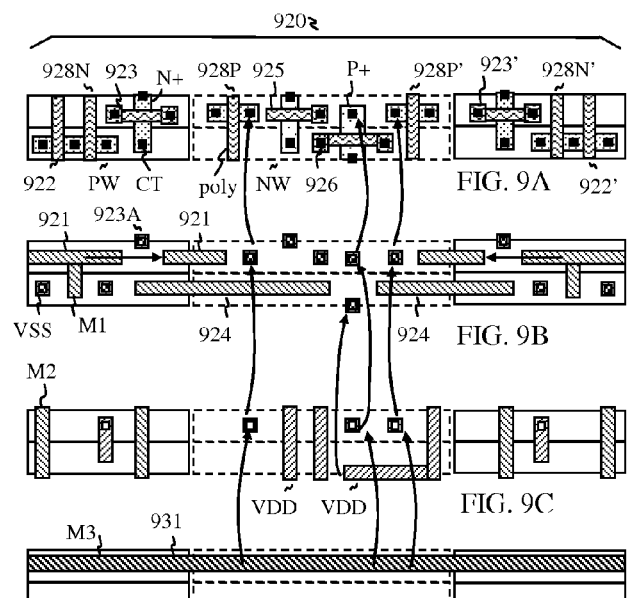
FIG. 9A
FIG. 9B
FIG. 9C
FIG. 9D
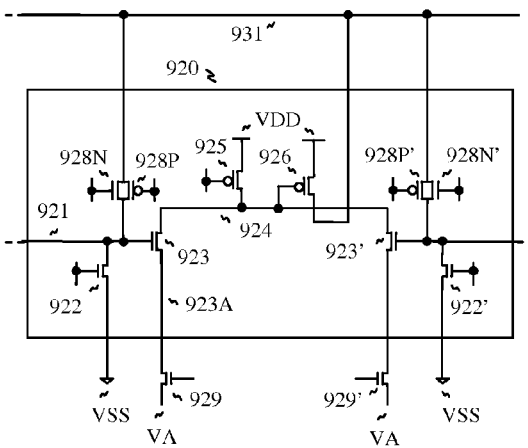
FIG. 9E

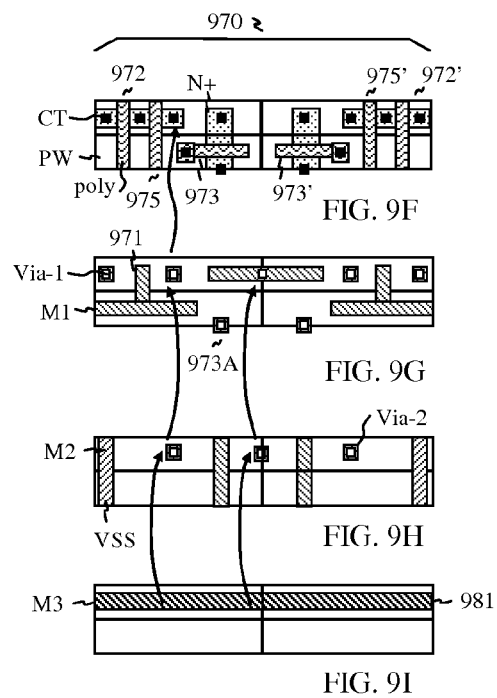
FIG. 9F
FIG. 9G
FIG. 9H
FIG. 9I
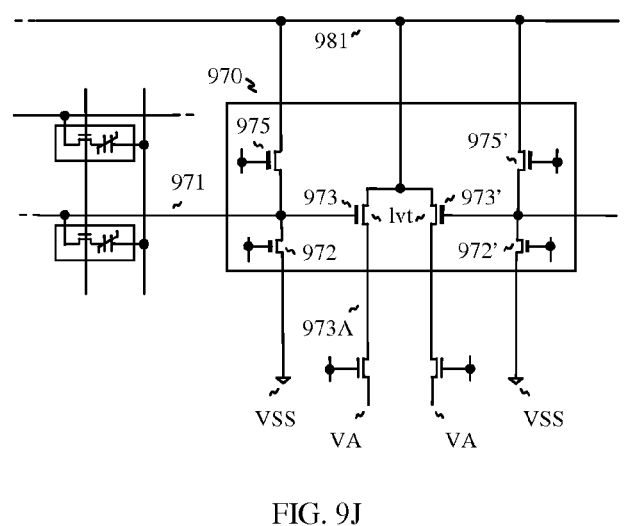
FIG. 9J
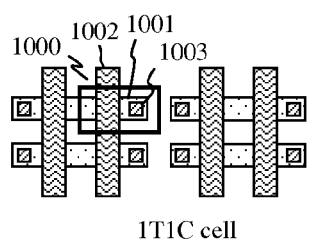
FIG. 10A (6F² Cell)
1T1C cell
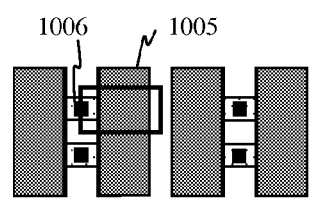
FIG. 10C
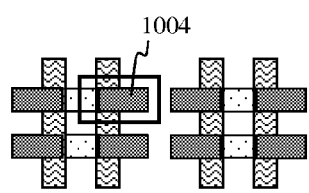
FIG. 10B
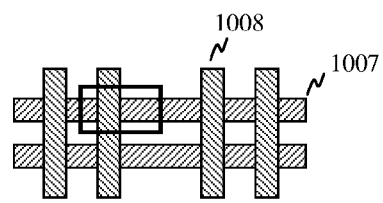
FIG. 10D 2T1C cell (8F² Cell)

FIG. 12C (4F² Cell)

FRAM INCLUDING A TUNABLE GAIN AMP AS A LOCAL SENSE AMP

CROSS REFERENCE TO RELATED APPLICATION

The present invention is a continuation of application Ser. No. 12/253,997, filed on Oct. 19, 2008, which is herein incorporated by reference.

FIELD OF THE INVENTION

The present invention relates generally to integrated circuits, in particular to FRAM (Ferroelectric Random Access Memory).

BACKGROUND OF THE INVENTION

FRAM (Ferroelectric Random Access Memory) is a type of non-volatile memory device that uses such a ferroelectric capacitor and preserves stored information even when the power is off. Additionally, the FRAM has high-speed access, less power consumption, and excellent shock-resistance. Accordingly, the FRAM would be expected to be used as a main storage device for various electronic devices and equipment having file storing and retrieving functions, such as computers, networks and mobile devices.

In the FRAM, a memory cell is composed of the ferroelectric capacitor and a pass transistor, and which stores logical data "1" or "0" depending on polarization state of the ferroelectric capacitor. When a voltage is applied across the ferroelectric capacitor, a ferroelectric material is polarized according to the direction of an electric field. Hence, a threshold voltage at which a change in the polarization state of the ferroelectric material occurs is called a "coercive voltage". In reading data stored in the memory cell, a voltage is applied between both electrodes of the ferroelectric capacitor to cause a potential difference, and accordingly excite charges on a bit line. The state of the data stored in the memory cell is sensed as a change in an amount of the charges excited on the bit line.

In FIG. 1, a circuit of the ferroelectric random access memory is illustrated, as a prior art, "A 0.25-um 3.0-V 1T1C 32-Mb Nonvolatile Ferroelectric RAM with Address Transition Detector and Current Forcing Sense Amplifier Scheme", IEEE Journal of Solid-State Circuits, Vol. 37, No. 11, November 2002, wherein a word line 111 is connected to memory cells 150 and 151, next word line 112 is connected to memory cells 152 and 153, and last word line 113 is connected to memory cells 154 and 155. The memory cell 150 is composed of the pass transistor 156 and the ferroelectric capacitor 157. And plate lines 121 and 122 are connected to the capacitor of the memory cells. As shown in the figure, a plurality of memory cells is connected to single bit line for integrating more memory cells on a chip, so that the bit line is long and heavily loaded. With heavily loaded bit line, capacitance value of the ferroelectric capacitor should be big enough to drive the bit line for reading. And access time is slow because there is a waiting time before the bit line is redistributed by the charges of the ferroelectric capacitor.

In order to improve access time, hierarchical bit line architecture and multi-level cells are applied, as published, U.S. Pat. Nos. 6,240,007 and 7,304,881. However, differential amplifier is still used for sensing the stored data. As a result, the area is additionally increased, because the differential amplifier occupies relatively big space. Furthermore, the differential amplifier requires a reference voltage for comparing a voltage difference, which is one of difficult circuit with voltage and temperature variations, so that two memory cells store a data where one memory cell store positive data and another memory cell stores negative data for generating an inverted voltage reference.

And other prior art is published as U.S. Pat. No. 6,574,135 such that bit line is multi-divided into short lines for sharing a sense amplifier and a data buffer through the switch. However, bit line loading is still heavy, because the local bit line is connected to the global line through a transfer transistor when reading, which increases the effective capacitance of the local bit line. And one more prior art is published as U.S. Pat. No. 6,829,154 for dividing bit line into short lines. However, there is no adjustable gain sense amp for reading the memory cell more accurately. In this respect, there is still a need for improving the FRAM. More detailed explanation will be followed as below.

SUMMARY OF THE INVENTION

In the present invention, a tunable gain amp serves as a local sense amp for implementing FRAM (Ferroelectric Random Access Memory), wherein the tunable gain amp is connected to a local bit line for reading a memory cell including a pass transistor and a ferroelectric capacitor, and gain of the tunable gain amp is adjusted by setting a local amp voltage for reading the memory cell more effectively with optimized gain. And a global sense amp is connected to the local sense amp for receiving a read output.

And the bit line is multi-divided into short bit lines for reducing parasitic capacitance, so that the local bit line is quickly charged or discharged by the memory cell including a ferroelectric capacitor and a pass transistor when reading. With reduced capacitance of the local bit line, value of the ferroelectric capacitor can be proportionally reduced, which realizes to reduce effective area of the ferroelectric capacitor and reduce chip area for reducing wafer cost. In addition, power consumption is significantly reduced because charging and discharging current is reduced when operating.

When reading, a voltage difference in the local bit line is converted to a time difference by the sense amps for differentiating data "1" having high capacitance and data "0" having low capacitance in the ferroelectric capacitor of the memory cell. For example, data "1" in the memory cell is quickly transferred to the global sense amp through the local sense amp with high gain, but data "0" is rejected to be transferred by a locking signal based on data "1" as a reference signal.

In this manner, a time domain sensing scheme is realized to differentiate data "1" and data "0". More specifically, the reference signal is generated by one of fast changing data with high gain from reference cells, which signal serves as a reference signal to generate a locking signal in order to reject latching another data which is slowly changed with low gain, such that high capacitance data is arrived first while low capacitance data is arrived later, or low capacitance data is arrived first while high capacitance data is arrived later depending on configuration. The time domain sensing scheme effectively differentiates high capacitance data and low capacitance data with time delay control, while the conventional sensing scheme is current-domain or voltage-domain sensing scheme. In the convention memory, the selected memory cell charges or discharges the bit line, and the charged or discharged voltage of the bit line is compared by a comparator which determines an output at a time. On the contrary, in the present invention, there are many advantages to read the memory cell with time domain sensing, so that the sensing time is easily controlled by a tunable delay circuit, which compensates cell-to-cell variation and wafer-to-wafer variation, thus there is a need for adding a delay time before locking with a statistical data for all the memory cells, such as mean time between fast data and slow data. Thereby the tunable delay circuit generates a delay time for optimum range. And the read output from the memory cell is transferred to the output latch circuit through the returning read path, thus the access time is equal regardless of the location of the selected memory cell, which is advantageous to transfer the read output to the external pad at a time. And the reference signal is used for enabling the local write transfer gate for writing back the read data or overwriting a write data, which realizes fast cycle operation.

And, configuring memory is more flexible, such that multiple memory macros can be configured with small segmented memory array and multi-stage sense amps, instead of big macro with the conventional sense amps which includes differential amps. In the present invention, number of sense amps can be determined by the target speed. For example, high speed application needs more segmented array with more sense amps, while high density application needs more memory cells with reduced number of sense amps, thus cell efficiency is increased.

Many alternative configurations are described, such that the ferroelectric capacitor can be used as a volatile memory when a plate line is forced to a constant voltage for eliminating fatigue of the ferroelectric capacitor as an alternative configuration, which can replace the conventional DRAM. For obtaining long retention time for the volatile memory with the constant plate line, the local bit line is pre-charged to a predetermined voltage which is higher than ground voltage, so that sub-threshold leakage current is dramatically reduced during standby, because a word line is forced to ground voltage, which realizes a negative word line scheme without using any extra negative voltage source. More specifically, the source of the pass transistor connecting to the bit line is forced to higher than ground voltage, the word line is forced to ground voltage, and the stored charge is near supply voltage when storing data "1". Thus, the word line voltage is lower than the voltage of the source (bit line) and the drain (storage node). In contrast, data "0" can be lost easily, but the time domain sensing scheme does not read data "0" because the locking signal rejects data "0" to be latched as explained above.

And, two transistor and one ferroelectric capacitor (2T1C) memory is realized for replacing the conventional SRAM as an alternative configuration. The 2T1C memory cell operates nonvolatile mode as well, which is very useful for replacing the conventional SRAM cache memory with reduced area. Another useful alternative configuration is a series FRAM, which can replace the conventional flash memory.

And, a reduced memory cell can be read by the sensing scheme, such that the lightly loaded bit line can be charged or discharged the reduced capacitor as a storage element, which realizes to miniaturize the memory cell further as explained above. Moreover, the present invention realizes multi-stacked memory cell structure including thin film transistor because the memory cell only drives lightly loaded bit line even though thin film polysilicon transistor can flow lower current than that of the conventional single crystal silicon transistor, such as, 10-20 times lower, for example.

And, a fingered shape capacitor is used as a storage capacitor for increasing storage capacitance in a given area, which realizes very high density memory, wherein the fingered shape capacitor is composed of a first fingered shape plate and a second fingered shape plate. And also multiple fingered shape capacitors can be formed in between metal routing layers for eliminating deep contact, where each capacitor is connected through relatively shallow contact.

And, example memory cell layout and cross sectional views are illustrated to minimize cell area. And the fabrication method is compatible with the conventional CMOS process including single-crystal-based regular transistor. And alternatively, additional steps are required for using thin film transistor as a pass transistor of the memory cell. And the memory cell can be formed from various semiconductor materials, such as silicon-germanium and germanium.

Furthermore, various ferroelectric capacitors can be used as a nonvolatile storage element, such as lead zirconate titanate (PZT), lead lanthanum zirconium titanate (PLZT), barium strontium titanate (BST), and strontium bismuth tantalate (SBT).

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 2B illustrates hysteresis curve of the ferroelectric capacitor, FIG. 2C illustrates an I-V curve of the local amplify transistor when reading data "1", FIG. 2D illustrates an I-V curve of the local amplify transistor when reading data "0", FIG. 2E illustrates timing waveform for reading data "1", FIG. 2F illustrates timing waveform for reading data "0", and FIGS. 2G, 2H, 2I, 2J, 2K and 2L illustrate simulated waveforms with SPICE simulator, according to the teachings of the present invention.

FIG. 5A illustrates an alternative memory segment operating with 1T1C memory cell as a volatile memory.

FIG. 8D illustrates a local amp voltage generator for generating a local amp voltage, and FIG. 8E illustrates a bias voltage generator, according to the teachings of the present invention.

FIGS. 9A, 9B, 9C and 9D illustrate an example layout for the local sense amp, FIG. 9E illustrates the related local sense amp circuit for explaining the layout, FIGS. 9F, 9G, 9H and 9I illustrate another example layout for the local sense amp, and FIG. 9J illustrates the related local sense amp circuit for explaining the other layout, according to the teachings of the present invention.

FIGS. 10A, 10B, 10C and 10D illustrate an example memory cell layout for the memory cell.

FIG. 12C illustrates an example cross sectional view of the series memory cells.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
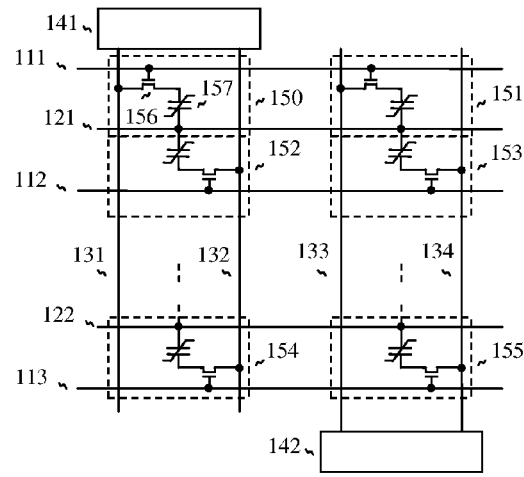
FIG. 1 illustrates a ferroelectric random access memory, as a prior art.
Figure 2A:
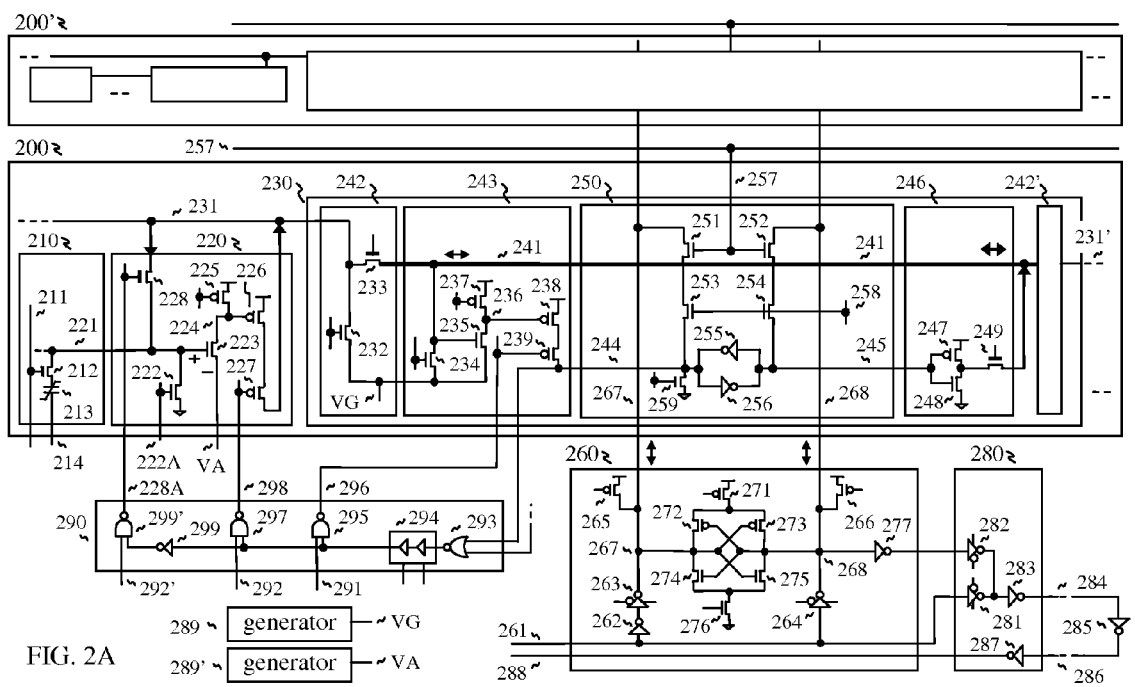
FIG. 2A illustrates high speed nonvolatile FRAM with 1T1C memory cell as the present invention.

The present invention is directed to FRAM including a tunable gain amp as a local sense amp shown in FIG. 2A, wherein a memory block 200 comprises a memory cell 210, the tunable gain amp as the local sense amp 220, and a global sense amp 230. The memory cell 210 is composed of a pass transistor 212 and a ferroelectric capacitor 213. A plate line 214 is connected to the ferroelectric capacitor, wherein the plate line 214 is raised to high when reading and writing for measuring and changing capacitance value of the ferroelectric capacitor 213. And a word line 211 is asserted to a VPP voltage which is higher than that of regulator voltage VDD for avoiding threshold voltage drop of the pass transistor. And the local sense amp 220 is connected to the memory cell 210 through a local bit line 221. For reducing parasitic capacitance of the local bit line, reduced numbers of memory cells are connected to the local bit line, such as 16 cells, 24 cells, 32 cells, 48 cells, 64 cells and 128 cells, while 256 cells and 512 cells are connected to a bit line in the conventional FRAM. In doing so, the storage capacitor can be proportionally reduced for driving the short bit line. And the local sense amp is small for inserting repeatedly into the memory cell array while the conventional differential sense amp is too big to insert into the memory cell array.

The local sense amp 220 is composed of a local reset transistor 222 for resetting the local bit line 221 to a ground voltage VSS, a local pre-amp transistor 223 for reading the memory cell 210 through the local bit line 221, where a source of the local amplify transistor 223 is forced to a local amp voltage VA for tuning gain of the amplifier with a local amp voltage generator 289', such that the local amp voltage VA is lowered for increasing gain with increased gate voltage and the local amp voltage VA is raised for reducing gain with reduced gate voltage A local pre-amp node 224 is connected to the local amplify transistor 223 for transferring a read output, a local pre-set transistor 225 is connected to the local pre-amp node 224 for pre-setting to a supply voltage VDD, and a local main-amp transistor 226 is connected to the local pre-amp node 224 for reading to the read output when a local amp enable transistor 227 is enabled. And a local write transfer gate 228 (including a transfer transistor) is connected to the local bit line 221 for connecting to a global bit line 231.

The local pre-amp transistor 223 detects whether the local bit line 221 is higher than a local amp voltage VA or not. When reading, the local pre-amp transistor 223 is used as a pre amplifier for discharging the local pre-amp node 224 which is very lightly loaded, and the local main-amp transistor 226 pulls up the global bit line 231 connecting to the global sense amp 230. And the local amp voltage VA is generated by a local amp voltage generator 289', so that the local amp voltage VA is set around VBL0 wherein the VBL0 is a local bit line voltage when reading data "0" (shown in FIG. 2C). And the local amp voltage VA is variably set for adjusting sensing margin by setting a fuse circuit. Similarly, a global amp voltage VG is generated by a global amp voltage generator 289 for adjusting the global bit line voltage, where the global amp voltage generator 289 is similarly configured with the local amp voltage generator 289', but the adjusted voltage is different. Detailed circuits about the fuse circuit and the generators will be explained as below.

And the global sense amp 230 is connected to the local sense amp 220 through the global bit line 231, wherein the global sense amp includes a common line 241 for connecting to its component circuits having a read circuit 243, a latch circuit 250, a write circuit 246, and at least a select circuit comprising a left select circuit 242 and/or a right select circuit 242'.

In the component circuits, the read circuit 243 includes a common pre-charge transistor 234 for pre-charging the common line 241 to the global amp voltage VG which is generated by a global amp voltage generator 289, a global pre-amp transistor 235 for reading the common line 241, a global pre-set transistor 237 for pre-setting a global pre-amp node 236 connecting to the global pre-amp transistor 235, and a global main-amp transistor 238 for reading to the global pre-amp node 236 when a global amp enable transistor 239 is enabled.

And the latch circuit 250 includes a cross coupled inverter latch having inverters 255 and 256 for connecting to a pair of latch nodes, a latch reset transistor 259 for resetting left latch node 244, and a pair of series transistors having a row select transistor pair 253 and 254 for connecting to the pair of the latch nodes and a column select transistor pair 251 and 252 for connecting to a pair of data lines 267 and 268. And the write circuit 246 includes an inverter receiving a voltage output of right latch node 245, and a write enable switch 249 receiving an output of the inverter and driving the common line 241, where the inverter is composed of a pull-up transistor 247 and a pull-down transistor 248.

And the left select circuit 242 is composed of a global pre-charge transistor 232 for pre-charging the global bit line 231 to the global amp voltage VG and a global select transistor 233 for connecting the global bit line 231 to the common line 241 in the left hand side. And, the right select circuit 242' is composed of the same circuit as the left select circuit 242 for connecting to a right global bit line 231' to the common line 241 in the right hand side. Alternatively, the global bit line 231 is directly connected to the common line 241 (not shown) without the select circuit, as an alternative configuration.

Figure 8A:
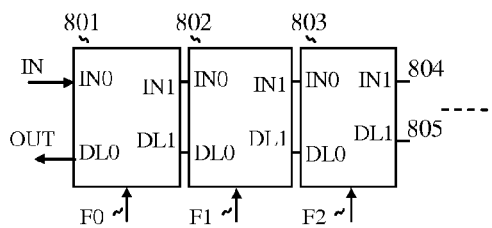
FIG. 8A illustrates a tunable delay circuit.
Figure 8B:
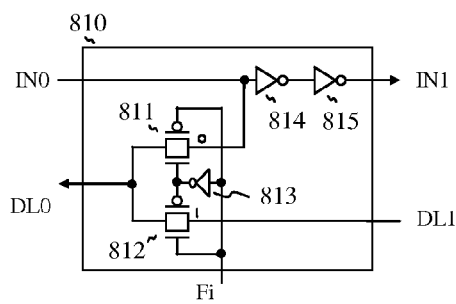
FIG. 8B illustrates a delay unit of the tunable delay circuit.

And the global amp enable transistor 239 is connected to a locking signal 296, such that the global amp enable transistor 239 is disabled after a read output from the memory cell is reached to the latch circuit 250. And the locking signal 296 is generated by a locking signal generator 290, wherein the locking signal generator 290 is composed of a NOR gate 293 for receiving an output from the latch circuit 250, a tunable delay circuit 294 (as shown in FIG. 8A) for delaying the read output of the latch circuit 250, and a NAND gate 295 for generating the locking signal 296, while a global read enable signal 291 is asserted to high. Another locking signal 298 is generated by another NAND gate 297 receiving the delayed output, in order to disable the local amp enable transistor 227 while a local read enable signal 292 is asserted to high. And the locking signal 296 and 298 are generated as long as one of reference memory cells works correctly. And a local write enable signal 228A is generated by a NAND gate 299' and an inverter 299 after locking, when a local write enable signal 292' is asserted to high during write-back operation or a write operation.

During read operation, a stored data in the memory cell 210 is transferred to the latch circuit 250 through the sense amps, for instance, high data is transferred to the latch circuit by the local sense amp and the global sense amp with high gain, but low data is not transferred with low gain because the global amp enable transistor 239 connecting to the latch circuit 250 is disabled by the locking signal 296 which is based on high data, before low data is arrived. Furthermore, the latch circuit is also used for write-back operation when the memory cell is accessed because the stored data in the memory cell 210 is destructed by the charges of the local bit line 221 when reading.

After the stored data is reached to the latch circuit 250, a row select signal 258 and a column select signal 257 are asserted to high, so that the read output is transferred to the data line sense amp 260 through the data line pair 267 and 268 while the latch reset transistor 259 is turned off. When reading data "1", a positive latch node 244 is raised to high from a pre-charge state by the read circuit 243, which does not discharge the positive data line 267, but a negative data line 268 is discharged to VSS voltage because a negative latch node 245 is discharged when the read circuit 243 pulls up the positive latch node 244, while the data lines 267 and 268 are released from the pre-charge transistors 265 and 266. The row enable transistor pair 253 and 254 is disabled by the row select signal 258 for avoiding a conflict in unselected memory block (not shown), because the positive latch node 244 is reset to VSS voltage for unselected memory block, while the data line 267 is pre-charged to supply voltage VDD. Thereby, unnecessary current flow is avoided for the unselected memory block during operation.

After then, the data line sense amp 260 is activated by turning on a pull-up transistor 271 and a pull-down transistor 276, such that PMOS transistor 272 and NMOS transistor 275 are turned on, while PMOS transistor 273 and NMOS transistor 274 are turned off, when reading data "1". The data line sense amp 260 accelerates discharging the data line 268. By discharging the negative data line 268, output data 288 is changed to high through inverting buffers including 277, 282, 283, 285 and 287, because the data select circuit 280 selects a read tri-state inverter 282 for transferring the read output, while a bypass tri-state inverter 281 is turned off. And there are as many as memory blocks (not shown) in a chip, so that unselected memory blocks select the bypass tri-state inverter for bypassing the read output to data output node. On the contrary, when reading data "0", the positive data line 267 is discharged but the negative data line 268 is not changed from the pre-charge state, Hence, the data out 288 keeps low.

And the read output is buffered by multiple inverting buffers 277, 282, 283, 285 and 287 including a forwarding read line 284 and a returning read line 286. With the returning read path, access time is almost same regardless of selected memory cell location, which realizes to latch the read output at a time with enough set-up and hold time even though a latch clock is fixed.

In the present invention, the local sense amp need not reference bit line because the local sense amp does not compare voltage or current with reference bit line, but the local sense amp detects whether the local pre-amp transistor 223 is turned on or not by the selected memory cell through the local bit line 221 while the local amp voltage VA sets up discharges time for tuning gain of the amplifier. Additionally, the local pre-amp transistor 223 and the global pre-amp transistor 235 can be composed of a low threshold MOS transistor as an alternative configuration for high speed application. Alternatively, the local write transfer gate 228 can be composed of a transmission gate including an NMOS transistor and a PMOS transistor for enhancing swing voltage (not shown).

For writing data, two write tri-state inverters 263 and 264 are turned on for driving the data line pair 267 and 268 respectively, while the data line sense amp 260 is de-activated by turning off pull-up transistor 271 and pull-down transistor 276, and the pre-charge transistors 265 and 266 are turned off as well. Thereby, write data is transferred to the latch circuit 250 through forwarding write line 261 and the two write tri-state inverters 263 and 264 with an inverter 262 for driving the data line pair 267 and 268. And then, the write data in the latch circuit is transferred to the memory cell through the write circuit 246, when the write enable switch 249, the global select transistor 233 in the global sense amp 230 and the local write transfer gate 228 in the local sense amp 220 are turned on. When writing data, the word line 211 is forced to higher than VDD+VT voltage for avoiding NMOS threshold voltage drop where VDD is a supply voltage and VT is threshold voltage of the MOS transistor. And also the write transistor 228, the global select transistor 233 and the write enable switch 249 are forced to higher than VDD+VT voltage. During write operation, the local amp enable transistor 227 and the global amp enable transistor 239 are disabled for transferring the write data to the memory cell through the local bit line 221 and the global bit line 231. And the swing voltage of the global bit line 231 and the common line 241 is limited from the VG voltage to VDD voltage when reading, but the swing voltage is raised to full voltage level from VSS voltage to VDD voltage by forcing a source of a pull-down transistor 248 of the write circuit 246 to VSS voltage, when writing or writing-back.

Referring now to FIG. 2B in view of FIG. 2A, hysteresis curve of the ferroelectric capacitor 213 is illustrated. When writing data "1", the capacitor is polarized at P1, and then the P1 is moved to P1' during standby. And when reading data "1", charges Q1 is exhibited, because the capacitor is reversely polarized by raising the plate line from low to high while the storage node of the capacitor is reset to low. In contrast, when writing data "0", the capacitor is polarized at P0, and then the P0 is moved to P0' during standby. And when reading data "0", charges Q0 is exhibited, because the capacitor is polarized in same direction by raising the plate line from low to high while the storage node is reset to low, where the capacitance value C is defined by charge Q divided by the applied voltage V (C=Q/V, where Q=CV).

Referring now to FIG. 2C in view of FIG. 2A, I-V curve of the local amplify transistor 223 is illustrated when reading. When the memory cell 210 stores data "1", the ferroelectric capacitor 213 stores charges Q1 (shown in FIG. 2B), so that the local bit line 221 is raised to VBL1 voltage with higher charges by raising the plate line 214 to high voltage, when the local reset transistor 222 is turned off, and the word line 211 is asserted to a predetermined voltage. For instance, the local bit line voltage 221 is raised from 0V to 0.50V (as shown VBL1 voltage in the figure), where local bit line capacitance is 5 fF and the exhibited capacitance C1 (C1 is defined by charges Q1 divided by the applied voltage as shown in FIG. 2B) is around 5 fF. Thereby the local amplify transistor 223 is turned on, which discharges the local pre-amp node 224 to the local amp voltage VA, where the threshold voltage of the local pre-amp transistor 223 is 0.35V and the local amp voltage VA is set to 0.30V. On the contrary, when the stored voltage in the memory cell is data "0", the ferroelectric capacitor 213 stores low charges Q0. Thus, the local bit line is raised from 0V to 0.29V (as shown VBL0 voltage in the figure), where local bit line capacitance is 5 fF and the exhibited capacitance C0 is 2 fF, for instance (C0 is defined by charges Q0 divided by the applied voltage as shown in FIG. 2B), because gate to source voltage Vgs of the local amplify transistor 223 is 0V. Thereby the local pre-amp transistor 223 keeps turn-off state.

Referring now to FIG. 2D in view of FIG. 2A, discharge time of the local pre-amp node 224 is illustrated, wherein the local pre-amp node 224 is quickly charged to the local amp voltage VA, when reading data "1", because the local amplify transistor 223 is turned on. In contrast, the local pre-amp node 224 is not charged within a short time, when reading data "0", because the local amplify transistor 223 is turned off.

Referring now to FIG. 2E in view of FIG. 2A, detailed timing diagram when reading data "1" is illustrated. To read data, a local reset (RS) signal 222A is de-asserted to low for releasing the local bit line 221, and then the word line 211 is raised to a predetermined voltage while the local write transfer gate 228 is turned off by write enable (WE) signal 228A. After then, the plate line 214 is raised to VDD voltage, so that the local bit line (LBL) 221 is charged to VBL1 voltage from VSS voltage because the ferroelectric capacitor 213 is pulled up by the plate line 214. The charged voltage VBL1 is determined by capacitance ratio between the ferroelectric capacitor 213 and the capacitance of the local bit line 221. Higher ferroelectric capacitance pulls up bit line higher. Thus the local pre-amp transistor 223 is turned on, which discharges the local pre-amp node (PM1) 224 to the local amp voltage VA from the pre-set voltage VDD.

By discharging the local pre-amp node (PM1) 224, the local main-amp transistor 226 is turned on, which pulls up the global bit line (GBL) 231, while the local amp enable transistor 227 is turned on, but the global pre-charge transistor 232 and the global write enable switch 249 are turned off. When the global bit line 231 is raised to VDD voltage from the global amp voltage VG, the latch circuit 250 is changed from the reset state by turning on the global main-amp transistor 238 when the global select transistor 233 and the global amp enable transistor 239 are also turned on, but the latch reset transistor 259 is turned off, because the common line 241 is charged by the global bit line 231. And then, the read output in the latch circuit is transferred to the data lines 267 and 268, respectively, after the pre-set transistors 265 and 266 are turned off. And the data line sense amp 260 is activated to amplify the data line voltage, such that the negative data line 268 is quickly discharged while the positive data line 267 keeps high. By discharging the negative data line 268, the data output 288 is changed to high through the inverting buffers including 282, 283, 285 and 287, while the read tri-state inverter 282 is turned on but the bypass tri-state inverter 281 is turn-off state.

After reading, a read bar signal as a locking signal 296 is de-asserted for disabling the read circuit 243. And then, write-back operation is executed, such that the read data in the latch node 245 is written back to the memory cell through the local write transfer gate 228, when a write enable signal 228A is asserted. Or read-modify-write operation can be executed, where broken lines in the local bit line (LBL) 221 and the global bit line (GBL) 231 illustrate to modify from data "1" to data "0", so that the local bit line 221 and the storage node (not shown) is inverted by the modified data. With write-back operation, the ferroelectric capacitor is written back or over-written (modified), which means that the ferroelectric capacitor is polarized. After write-back operation, all the control signals including the local reset signal (RS) 222A, the word line, and other control signals, are returned to the reset state or standby mode. And, during standby, the write data line 261 keeps low for resetting an output node of the bypass tri-state inverter 281, because the bypass tri-state inverter 281 is turned on, which prevents a conflict with high data from the read tri-state inverter 282 when the memory block is activated.

Referring now to FIG. 2F in view of FIG. 2A, detailed timing for reading data "0" is illustrated, wherein the local bit line (LBL) 221 is slightly raised to VBL0 voltage when reading data "0" because the polarized ferroelectric capacitor exhibits low charges Q0 (as shown in FIG. 2B). The local amplify transistor 223 is turned off, which does not discharge the local pre-amp node 224. And the local main-amp transistor 226 keeps turn-off state. Thereby, the global bit line 231 keeps a pre-charge state at VG voltage, which does not change the latch circuit 250. And other read path keeps the pre-charge state. Hence the data output (DO) 288 keeps the pre-charge state at low. However, the local pre-amp node (PM1) 224 is very slowly discharged by turn-off current through the local pre-amp transistor 223. And the global bit line 231 can be charged by the turn-off current of the local main-amp transistor 226. The turn-off leakage current depends on transistor parameters, temperature and substrate voltage for the transistor. Hence, the global bit line 231 may be gradually pulled up, which may change the latch circuit 250 while the global amp enable transistor 239 is enabled. For reducing turn-off current, long channel transistors can be used for the local pre-amp transistor 223, the local main-amp transistor 226, the global pre-amp transistor 235 and the global main-amp transistor 238, while the local reset transistor 222, the local pre-set transistor 225, the global pre-charge transistor 232 and the global pre-set transistor 237 can be composed of relatively short channel transistor, which helps to keep the pre-charge state when reading data "0", alternatively. In order to avoid the false flip with the leakage current when reading data "0", the global amp enable transistor 239 is turned off by the locking signal (LS) 296 which is generated by the locking signal generator 290 receiving fast data (data "1") with delay time as shown TD, so that data "0" is rejected to be latched to the latch circuit because data "0" is arrived later. This means that the latch circuit 250 keeps the reset state when reading data "0", such that this operation is called locking with the locking signal. After reading data "0", the write-back operation is executed by asserting the write enable signal 228A. And then, all the control signals including the word line, the write enable signal and others are returned to the pre-charge state or standby mode.

In this manner, the locking signal 296 effectively differentiates high data and low data where the memory block 200 serves as a reference memory block storing data "1" while a main memory block 200' stores main data, so that this sensing scheme is called "time domain sensing scheme", which can differentiate high data and low data within a predetermined time domain even though the leakage current is relatively high. Thereby, data "1" in the memory cell 210 is quickly transferred to the latch circuit through the local sense amp with high gain, which generates the locking signal, but data "0" is not transferred with low gain, thus the locking signal effectively rejects data "0" not to be latched. In other words, fast cycle memory (with no page mode) does not require the locking signal which is generated by the reference signal based on reference cells storing data "1", because data "0" is not reached to the latch within a short cycle. Thus, an enable signal from a control circuit is used to control the global amp enable transistor for fast cycle operation, which does not require reference cells and related circuits. And by applying multi-divided bit line architecture, fast read operation and write operation are realized. And also the memory cell can be reduced, because the memory cell drives only lightly loaded bit line, which means that the capacitor can be reduced for realizing very high density memory.

Referring now to FIG. 2G in view of FIG. 2A, simulated waveforms when reading data "1" with SPICE (Simulation Program with Integrated Circuit Emphasis) simulator are illustrated, wherein the waveforms are duplicated from actual simulator output with painstaking. The word line (WL) 211 is asserted for selecting the memory cell 210, and then the plate line (PL) 214 is asserted to high for pulling up the ferroelectric capacitor 213 for measuring the stored capacitance value. Thereby, the storage node (SN) (which is drain node of the pass transistor 212) is coupled by the capacitor 213 when the plate line 214 is pulling up. By coupling the storage node (SN), the local bit line (LBL) 221 is raised to VBL1 voltage, so that the local pre-amp transistor 223 is turned on, which discharges the local pre-amp node (PM1) 224. By discharging the local pre-amp node (PM1) 224, the local main-amp transistor 226 is turned on, which pulls up the global bit line (GBL) 231 when the local amp enable transistor 227 is turned on. Hence the latch node (LAT) 244 is flipped by the read circuit 243 while the global amp enable transistor 239 is turned on. And the latched data of the latch circuit 250 is transferred to the data output (DO) 288 through the returning read path. At the same time, the write enable signal 228A is generated by a delayed signal which is generated by the locking signal generator 290, which is used for restoring the read data as a write-back operation, such that the capacitor is positively polarized, while the storage node is at high and the plate line is at low.

Referring now to FIG. 2H in view of FIG. 2A, simulated waveforms when reading data "0" with SPICE simulator are illustrated, wherein the word line (WL) 211 is asserted for selecting the memory cell 210, and then the plate line (PL) 214 is asserted. By asserting the word line and the plate line, the storage node (SN) is also raised by the capacitor 213. By raising the storage node, the local bit line (LBL) 221 is raised to VBL0 voltage, but the VBL0 voltage (when reading data "0") is lower than that of VBL1 voltage (when reading data "1"), because the polarized capacitance of the memory cell storing data "0" is lower than that of storing data "1", so that the local pre-amp transistor 223 keeps turn-off state or very weakly turned on, which does not discharge the local pre-amp node (PM1) 224 at a short time. As a result, the global bit line (GBL) 231 keeps low, which does not change the latch node (LAT) 244. Hence, the data output (DO) 288 is not changed by the latch node 244. And, the write back operation is executed by the write enable signal 228A which is generated by reading data "1" as explained above. During write back operation, the capacitor is negatively polarized, while the storage node is at low and the plate line is at high.

Referring now to FIG. 2I in view of FIG. 2A, simulated waveforms are separately illustrated for ease of understanding, wherein the word line (WL) 211 is asserted first for selecting the memory cell 210, and then the plate line (PL) 214 is asserted for pulling up the memory cell. In the waveforms, the solid line of the storage node SN (H) shows data "1", which is raised to higher than the broken line showing the storage node SN (L) for reading data "0".

Referring now to FIG. 2J in view of FIG. 2A, simulated waveforms of the local bit lines are illustrated, wherein the solid line shows the local bit line LBL 221 (H) when reading data "1", and the broken line shows the local bit line LBL 221 (L) when reading data "0".

Referring now to FIG. 2K in view of FIG. 2A, simulated waveforms of the amplify nodes are illustrated, wherein the solid line shows the local pre-amp node 224 (H) when reading data "1", and the broken line shows the local pre-amp node 224 (L) when reading data "0".

And referring now to FIG. 2L in view of FIG. 2A, simulated waveforms of the global bit lines are illustrated, wherein the solid line shows the global bit line GBL 231 (H) when reading data "1", and the broken line shows the global bit line GBL 231 (L) when reading data "0".

As shown in the simulated waveforms, the local amp voltage VA is adjusted for reading the local bit line, and also the global amp voltage VG is adjusted for reducing voltage swing of the global bit line at sensing time, which reduces peak current. And the local amp voltage and the global amp voltage are generated by the local amp generator and the global amp voltage generator, respectively.

Figure 3:
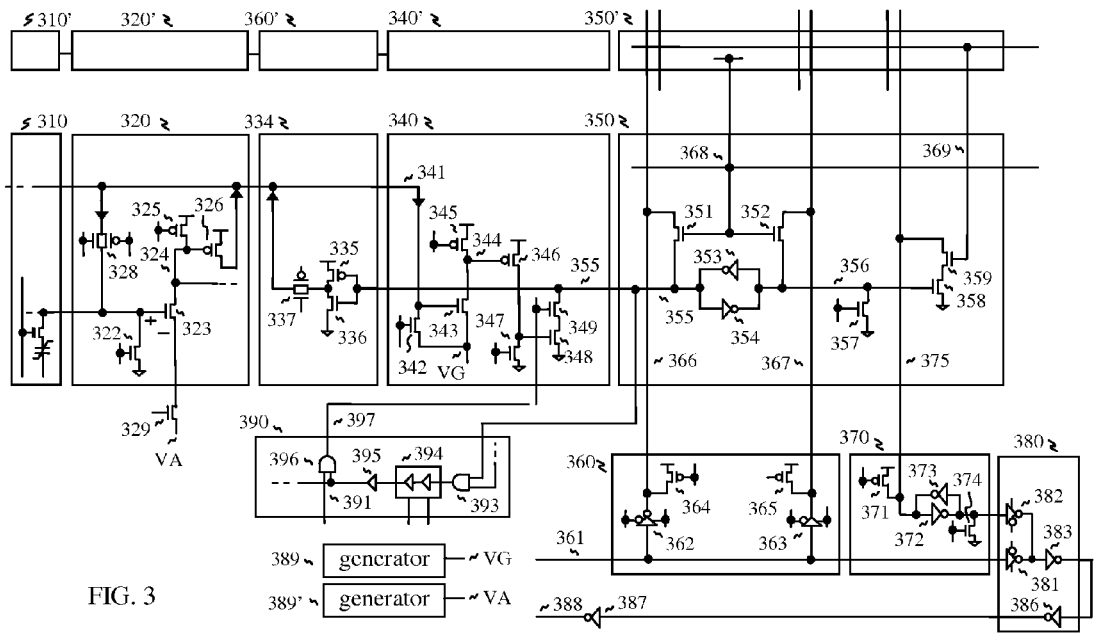
FIG. 3 illustrates an alternative configuration of the global sense amp for improving read operation, according to the teachings of the present invention.

In FIG. 3, an alternative configuration of the global sense amp for enhancing the write operation and the read operation is illustrated, wherein the local write transfer gate 328 is composed of a transmission gate and the NMOS pull-down transistors 348 and 349 can strongly pull down a latch node of the latch circuit, when reading data "1".

More specifically, the memory cell 310 is connected to the local sense amp 320 through the local bit line 321, wherein the local sense amp 320 is composed of a local reset transistor 322 for resetting the local bit line 321 to a ground voltage VSS, a local pre-amp transistor 323 for reading the memory cell 310 through the local bit line 321, where a source of the local amplify transistor 323 is forced to a local amp voltage VA for tuning gain of the amplifier with a local amp voltage generator 389', such that the local amp voltage VA is lowered for increasing gain with increased gate voltage and the local amp voltage VA is raised for reducing gain with reduced gate voltage. And a local pre-amp node 324 is connected to the local amplify transistor 323 for transferring a read output, a local pre-set transistor 325 is connected to the local pre-amp node 324 for pre-setting to a supply voltage VDD, and a local main-amp transistor 326 is connected to the local pre-amp node 324 for reading. The local amplify transistor 323 is connected to a local pull down transistor 329 for discharging the local pre-amp node 324 to the local amp voltage VA, when reading. And a local write transfer gate 328 is connected to the local bit line 321 for connecting to a global bit line 331, where the local write transfer gate 328 is composed of a transmission gate for enhancing the write operation with full swing transferring.

And the global sense amp includes a write circuit 334, a read circuit 340, a latch circuit 350. And the global sense amp is connected to a common line 341. And the read circuit 340 includes a common pre-charge transistor 342 for pre-charging the common line 341 to the global amp voltage VG, a global pre-amp transistor 343 connecting to a global pre-amp node 344 for reading the common line 341, a global pre-set transistor 345 for pre-setting the global pre-amp node 344, a global middle-amp transistor 346 connecting to the global pre-amp node 344 for transferring a read output from the global pre-amp including transistors 343 to a global main-amp, wherein strong NMOS pull-down transistors are used for the global main amp, which can easily flip a left latch node 355 as a negative latch node when reading data "1". And the global main-amp is composed of a global main-amp reset transistor 347 for resetting the global main-amp node 344 which is connected to an input of a global main-amp transistor 348 for transferring a read output from the global middle-amp including the global middle-amp transistor 346, when a global amp enable transistor 349 is enabled. And the global amp enable transistor 349 is connected to the left latch node 355. The global amp voltage VG is generated by a global amp voltage generator 389, and the local amp voltage VA is generated by a local amp voltage generator 389'.

And the latch circuit 350 includes a cross coupled inverter latch having inverters 353 and 354 for connecting to a pair of latch nodes 355 and 356, a latch reset transistor 357 for resetting one of the latch nodes, a pair of write transistors 351 and 352 for connecting to a pair of write data lines 366 and 367 for writing, and a read amplify transistor 358 for reading one of the latch nodes, when a column read transistor 359 is enabled.

In addition, the latch circuit 350 is connected to a data write circuit 360 for overwriting a data in the cross coupled inverter latch of the latch circuit through the pair of write data lines 366 and 367, and a data read circuit 370 for reading an output of the cross coupled inverter latch of the latch circuit through a read data line 357. More specifically, the data write circuit 360 includes an inverting write tri-state inverter 362 and a non-inverting write tri-state inverter 363 for driving the pair of write data lines 366 and 367, pre-charge transistors including 364 and 365 for pre-setting the pair of write data lines. More detailed operation will be explained as below.

And the write circuit 334 receives an output from the cross coupled inverter latch having inverters 353 and 354 for driving the common line 341, wherein the write circuit 334 includes an inverter having a pull-up transistor 335 and a pull-down transistor 336. And a write enable switch 337 (including a transmission gate) receives an output of the inverter and drives the common line 341 during write operation. For reading, a read data line 375 is connected to the read amplify transistor 358 which is enabled by the column read transistor 359, where the column read transistor 359 is enabled by a column read signal 369.

And the global amp enable transistor 349 is connected to a locking signal 397, such that the global amp enable transistor 349 is disabled after a read output from the memory cell is reached to the latch circuit 350. And the locking signal 397 is generated by a locking signal generator 390, wherein the locking signal generator 390 is composed of an AND gate 393 for receiving an output from the latch circuit 350, a tunable delay circuit 394 (as shown in FIG. 8A) for delaying the read output of the latch circuit 350, a buffer 395 for buffering the delayed output, and another AND gate 396 for generating the locking signal 397, while a global read enable signal 391 is asserted to high. The locking signal 397 is generated as long as one of reference memory cells works correctly with the AND gate 393. In order to generate the locking signal, a reference signal is generated by at least a reference global sense amp comprising the write circuit 334, the read circuit 340, and the latch circuit 350. Similarly, main global sense amp is composed of a memory cell 310', a local sense amp 320', a write circuit 334', a read circuit 340', and a latch circuit 350'. Furthermore, there are numerous main global sense amps in the columns, even though only one main global sense amp is drawn in the figure.

During read operation, a stored data in the memory cell is transferred to the latch circuit 350 through the sense amps, for instance, high data is transferred to the latch circuit by the local sense amp and the global sense amp with high gain, but low data is not transferred with low gain because the global amp enable transistor 349 connecting to the latch circuit 350 is disabled by the locking signal 397 which is based on high data, before low data is arrived. Furthermore, the latch circuit is also used for write-back operation when the memory cell is accessed because the stored data in the memory cell is destructed by the charges of the local bit line when reading.

After the stored data is reached to the latch circuit 350, a column read signal 369 is asserted to high, so that the read output is transferred to the data read circuit 370 through the read data line 375. When reading data "1", a positive latch node 356 is raised to high from a reset state because the negative latch node 355 is pulled down by the read circuit 340. Hence a read data line 375 is discharged to VSS voltage by the read amplify transistor 358 while the read enable transistor 359 is turned on by asserting the column read signal 369. By discharging the read data line 375, the data output 388 is raised to high through the inverting buffers including 372, 382, 383, 386 and 387, while the read tri-state inverter 382 is turned on but the bypass tri-state inverter 381 is turned off in a data switch circuit 380. However, data output 388 keeps low when reading data "0", because the read data line 375 is not discharged while the positive latch node 356 keeps reset state, which turns off the read amplify transistor 358 even though the read enable transistor 359 is turned on. Hence, the read data line 375 is maintained to VDD voltage by a cross inverter latch including inverters 372 and 373, where a reset transistor 374 is used for resetting the cross coupled inverter latch during standby. When the memory block is not selected, the positive latch node 356 is reset to VSS voltage by the latch reset transistor 357, which turns off the read amplify transistor 358. Thus, there is no discharge path from the unselected memory block even though the read enable transistor is controlled in column direction, while the read data line 375 is pre-charged to supply voltage VDD, because the read data line 375 is pre-charged to VDD voltage by a pre-charge transistor 371 while unselected.

During write operation, a data write circuit 360 is activated, such that an inverting write tri-state inverter 362 and a non-inverting write tri-state inverter 363 are enabled for driving the write data line pair 366 and 367, while the pre-charge transistors 364 and 365 are turned off. When writing data "1", the positive latch node 356 is raised to high by forcing the data input 361 to high, such that the non-inverting write tri-state inverter 363 drives the positive data line 367 to high while the column write transistor 352 is turned on, and the inverting write tri-state inverter 362 drives the negative data line 366 to low while the column write transistor 351 is turned on. In contrast, the positive data line 367 is driven to low, and the negative data line 366 is driven to high, when writing data "0".

Figure 4A:
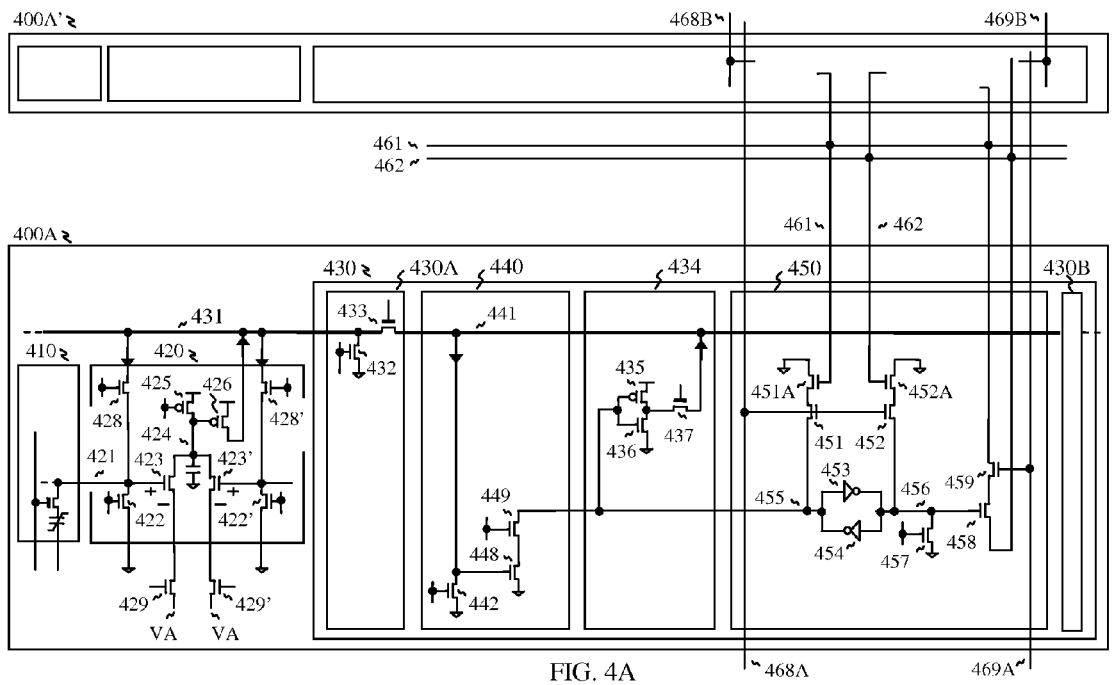
FIG. 4A illustrates an alternative configuration including shared local main-amp transistor.

In FIG. 4A, an alternative configuration including shared local main-amp transistor is illustrated, wherein a memory block 400A comprises a memory cell 410, a local sense amp 420, and a global sense amp 430. The memory cell 410 is the same circuit as FIG. 2A. The local sense amp 420 includes eight transistors with sharing portions, such that the local sense amp 420 includes a left local reset transistor 422 for resetting a left local bit line 421, a left local pre-amp transistor 423 for reading the left memory cell 410 through the left local bit line 421, a right local reset transistor 422' for resetting a right local bit line, a right local pre-amp transistor 423' for reading a right memory cell through the right local bit line, a local pre-set transistor 425 connecting to the left local pre-amp transistor 423 and the right local pre-amp transistor 423' through a local pre-amp node 424, a local main-amp transistor 426 for reading the pre-amp node, a left local write transfer gate 428 connecting to the left local bit line 421 for receiving a write data from the global bit line 431, and a right local write transfer gate 428' connecting to the right local bit line for receiving the write data from the global bit line 431. Alternatively, a capacitor can be connected to the local pre-amp node 424 for adjusting discharge time. And a left local pull-down transistor 429 is connected to the left local amplify transistor 423 for supplying the local amp voltage VA, and a right local pull-down transistor 429' is connected to the right local pull-down transistor 423' for supplying the local amp voltage VA, where the local amp voltage VA is adjusted for tuning gain of the amp.

The global sense amp 430 is slightly modified, wherein the global sense amp 430 includes a read circuit 440, a latch circuit 450, a write circuit 434, a left select circuit 430A and a right select circuit 430B, and those circuits are connected to a common line 441, where the left select circuit 430A and the right select circuit 430B are connected to a left global bit line 431 and a right global bit line respectively, for connecting to multiple local sense amps (not shown).

And the read circuit 440 is modified for reducing transistors, wherein the read circuit 440 includes a common reset transistor 442 for resetting the common line 441 to the ground voltage VSS, a global amplify transistor 448 for reading the common line node 441, and a global amp enable transistor 449 connecting to the global amplify transistor 448 for enabling. And the global amp enable transistor 449 is connected to the left latch node 455 as a negative latch node. And the left select circuit 430A is also modified for resetting the global bit line 431 to the ground voltage, such that the left select circuit 430A is composed of a global reset transistor 432 for resetting the global bit line 431 to ground voltage and a global select transistor 433 for connecting the global bit line 231 to the common line 441 in the left hand side. With ground reset global bit line, read current is slightly increased because the global bit line changes from ground to VDD voltage when reading, but area is slight reduced.

And the latch circuit 450 includes a cross coupled inverter latch having inverters 453 and 454, a latch reset transistor 457 for resetting the right latch node 456 as a positive latch node, and a row write transistor pair 451 and 452 is connected to a column write transistor pair 451A and 452A which are controlled by a data line pair 461 and 462 (in column direction). When writing data "1", the negative latch node 455 is pulled down by the series transistors 451 and 451A because a current path is set up by turning on the column write transistor 451A, while the row write transistor 451 is enabled by the write enable signal 468A and the data line 461 is asserted to high. But the other series transistors 452 and 452A are not set up a current path to the positive latch node 456 because the other column control line 462 keeps low, which turns off the other column write transistor 452A. When writing data "0", the positive latch node 456 is pulled down reversely.

And the write circuit 434 receives an output from the cross coupled inverter latch for driving the common line 441, wherein the write circuit 434 includes an inverter having a pull-up transistor 435 and a pull-down transistor 436. And a source node of the pull-down transistor 436 is connected to a ground voltage for writing data "0", and a source node of the pull-up transistor 435 is connected to VDD voltage for writing data "1". A write enable transistor 437 receives an output of the inverter and drives the common line 441 during write operation.

When reading data "1", the data line 461 is discharged by a current path which is set up through the data line 462, such that the read enable signal 469A is asserted to high for turning on a read enable transistor 459 and the positive latch node 456 is raised to high for turning on a read amplify transistor 458, while the data line 462 is asserted to low for read operation. Otherwise, the data line 461 is not discharged when reading data "0", because the positive latch node 456 keeps low, which turns off the read amplify transistor 458. When the memory block 400A is selected, a read data from selected memory block 400A reads a read data through the read path, but another memory block 400A' is not selected because another read enable signal 469B keeps low even though the column control line 461 is common in the column direction. Similarly, a write data is not transferred to another memory block 400A' when the write enable signal 468B is not asserted during write operation. In doing so, one of two columns is decoded by the decoding signals.

Figure 4B:
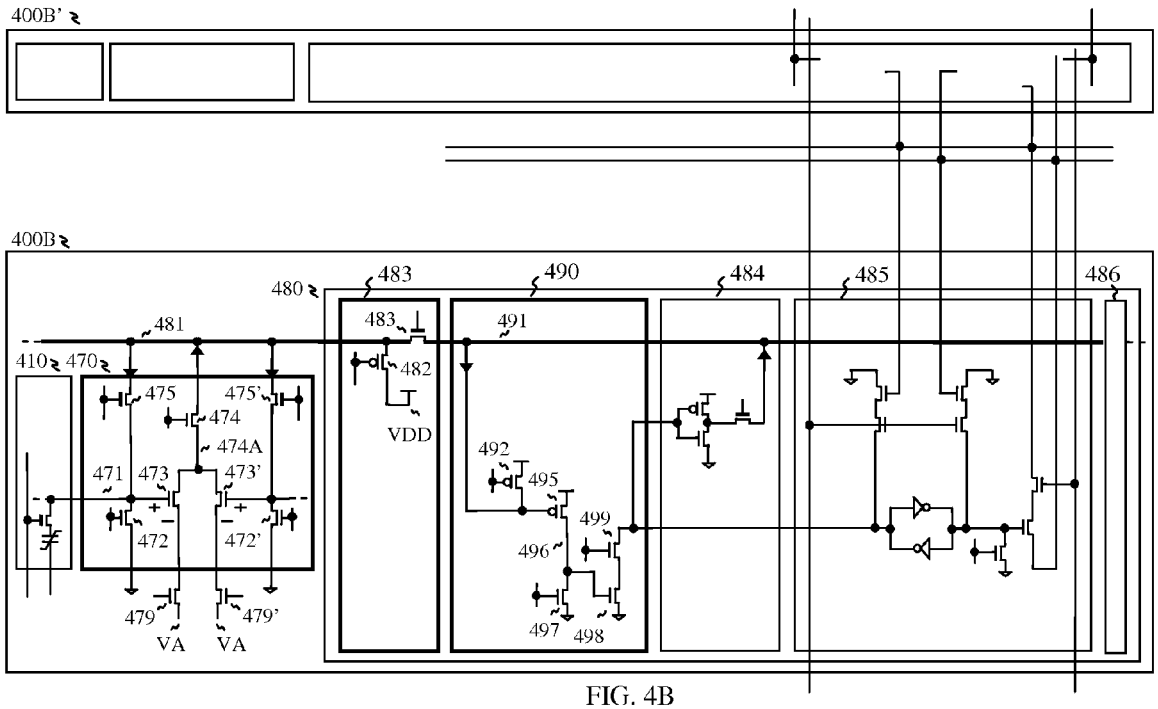
FIG. 4B illustrates an alternative configuration including shared local amp enable transistor with NMOS configuration.

In FIG. 4B, an alternative configuration including a shared local amp enable transistor with NMOS configuration is illustrated, wherein a memory block 400B comprises a memory cell 410, a local sense amp 470, and a global sense amp 480. And another memory block 400B' is the same configuration as that of 400.

The local sense amp 470 is composed of seven transistors including a (shared) local amp enable transistor 474 for reducing area, and all NMOS transistor are used for configuring the local sense amp, which reduces area without p-well to n-well space. In the configuration, the local sense amp 470 is composed of a left local reset transistor 472 for resetting a left local bit line 471, a left local amplify transistor 473 for reading a left memory cell 410 through the left local bit line 471, a right local reset transistor 472' for resetting a right local bit line, a right local amplify transistor 473' for reading a right memory cell through the right local bit line, the shared local amp enable transistor 474 connecting to a common node 474A which is connected to the left local amplify transistor 473 and the right local amplify transistor 473' for transferring a read output to the global bit line 481, a left local write transfer gate 475 connecting to the left local bit line for receiving the write data from the global bit line, and a right local write transfer gate 475' connecting to the right local bit line for receiving the write data from the global bit line 481.

And a left local pull-down transistor 479 is connected to the left local amplify transistor 473 for supplying the local amp voltage VA, and a right local pull-down transistor 479' is connected to the right local amplify transistor 473' for supplying the local amp voltage VA, where the local amp voltage VA is adjusted for optimizing gain of the amp.

And the read circuit 490 is modified for recovering the inverted phase of the global bit line with NMOS type local sense amp, wherein the read circuit 490 is composed of a common pre-set transistor 492 for pre-setting the common line 491, a global pre-amp transistor 495 for reading the common line 491, a global (amp) reset transistor 497 for resetting a global pre-amp node 496 connecting to the global pre-amp transistor 495, and the global main-amp transistor 498 for reading the global pre-amp node 496 when the global amp enable transistor 499 is enabled. And the global amp enable transistor 499 is connected to the left latch node for transferring data "1".

The memory cell 410 is the same circuit as FIG. 2A. And the latch circuit 485 and the write circuit 484 are also same as the FIG. 4A. But the left select circuit 483 and the right select circuit 486 are modified for pre-setting the global bit line 481 to VDD voltage, where the left select circuit 483 is composed of the global select transistor 483 and the global pre-set transistor 482.

Figure 4C:
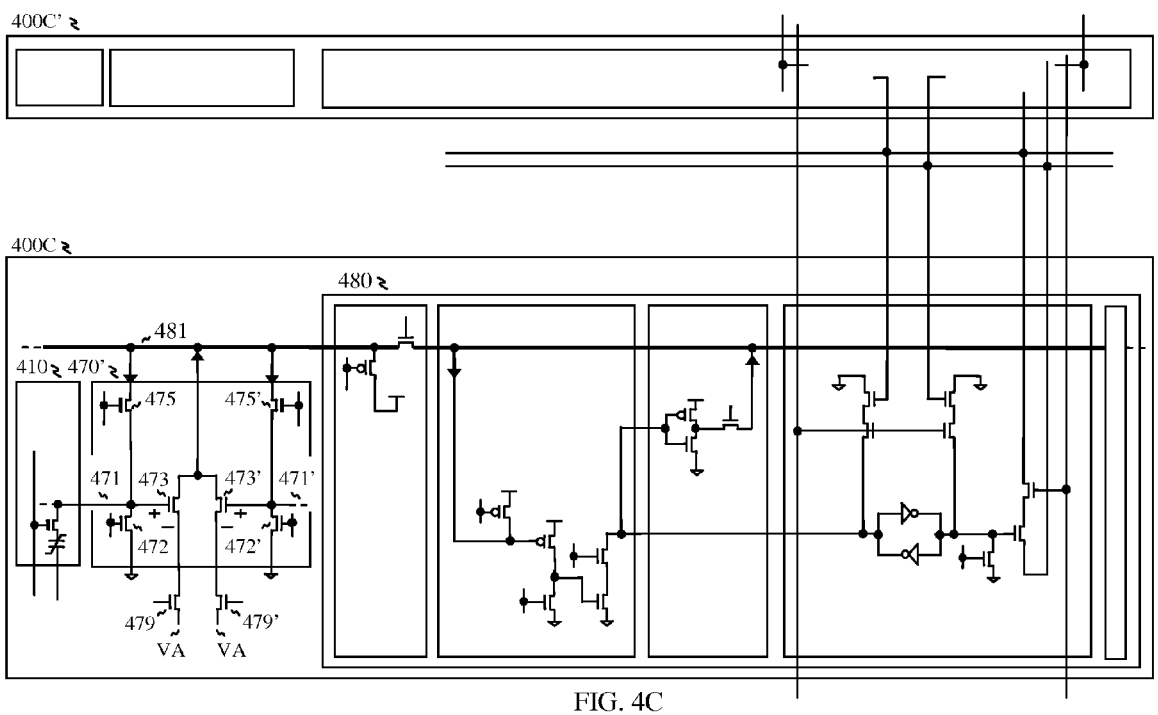
FIG. 4C illustrates an alternative configuration with six transistor local sense amp, according to the teachings of the present invention.

FIG. 4C illustrates an alternative local sense amp with six-transistor configuration, wherein a memory block 400C comprises a memory cell 410, a local sense amp 470', and a global sense amp 480. And the memory cell 410 and the global sense amp 480 are the same as those of FIG. 4B, but the local sense amp 470' is modified with six transistors for reducing area, where there is no local amp enable transistor. More specifically, the six transistor local sense amp 470' is composed of a left local reset transistor 472 for resetting the left local bit line 471, a left local amplify transistor 473 for reading the left memory cell 410 through the left local bit line 471, a left write transistor 475 is connected to the left local bit line 471 for receiving a write data from a global bit line 481, a right local reset transistor 472' for resetting the right local bit line 471', a right local amplify transistor 473' for reading the right memory cell 410 through the right local bit line 471', a right write transistor 475' is connected to the right local bit line 471' for receiving the write data from a global bit line 481. And a drain node of the left local amplify transistor 473 is connected to the global bit line 481 and a source node of the left local amplify transistor 473 is connected to a left local pull-down transistor 479 for amplifying, where the left local pull-down transistor 479 is connected to the local amp voltage VA for tuning gain of the amplifier. And a drain node of the right local amplify transistor 473' is connected to the global bit line 481 and a source node of the right local amplify transistor 473' is connected to a right local pull-down transistor 479' for amplifying, where the right local pull-down transistor 479' is connected to the local amp voltage VA for tuning gain of the amplifier.

In FIG. 5A, an alternative configuration is illustrated for realizing a volatile memory, wherein the plate line 515 in the memory cell 510 is connected to a constant voltage, such as a supply voltage VDD or half VDD voltage. Basically, the configuration of the memory block 500A is similar to that of FIG. 2A, except the plate line 515 is connected to a constant voltage source, the local bit line 521 and the global bit line 531 are pre-charged to a pre-charge voltage V0 for limiting the voltage swing from the V0 voltage and VDD voltage.

By pre-charging the local bit line to the V0 voltage, negative word line voltage is applied when storing data "1", such that the storage node 513 is charged to VDD voltage and the local bit line is pre-charged to the V0 voltage, for instance, V0=0.4V, while the word line 511 is forced to ground voltage during standby. With (pseudo) negative word line scheme, the sub-threshold leakage current is dramatically reduced during storing data, while data "0" is not read by the local sense amp in the present invention. Hence, there is no concern about losing data "0", and retention time for data "1" is significantly increased with the pseudo negative word line scheme. In the present invention, the word line is actually forced to ground voltage, so that it is less affected by gate-induced drain leakage current as shown in the prior art, which forces actual negative voltage to the word line as published, "Impact of Gate-Induced Drain Leakage on Retention Time Distribution of 256 Mbit DRAM With Negative Wordline Bias", IEEE Electron Devices, Vol. 50, No. 4, April 2003.

In the configuration, the memory block 500A comprises a memory cell 510, a local sense amp 520, and a global sense amp 530. The memory cell 510 is the same circuit as FIG. 2A. The local sense amp 520 is similar to that of FIG. 4A, such that the local sense amp 520 includes a left local reset transistor 522 for resetting a left local bit line 521, a left local amplify transistor 523 for reading a left memory cell through the left local bit line 521, a right local reset transistor 522' for resetting a right local bit line, a right local amplify transistor 523' for reading a right memory cell through the right local bit line, a local pre-set transistor 525 for connecting to the left local amplify transistor 523 and the right local amplify transistor 523' through a local pre-amp node 524, and a local main-amp transistor 526 for reading the local pre-amp node 524.

And a left local pull-down transistor 529 is connected to the left local amplify transistor 523 for supplying the local amp voltage VA, and a right local pull-down transistor 529' is connected to the right local pull-down transistor 523' for supplying the local amp voltage VA, where the local amp voltage VA is adjusted for tuning gain of the amp.

The global sense amp 530 is slightly modified, wherein the global sense amp 530 includes a read circuit 540, a latch circuit 550, a write circuit 534, a left select circuit 530A and a right select circuit 530B, and those circuits are connected to a common line 541, where the left select circuit 530A and the right select circuit 530B are connected to a left global bit line 531 and a right global bit line respectively, for connecting to multiple local sense amps (not shown). In the configuration, the left select circuit 530A is composed of a global pre-charge transistor 532 for pre-charging the left global bit line 531 to the pre-charge voltage V0 and a global select transistor 533 for selecting the left global bit line 531, and the right select circuit 530B is composed of the same circuit as the left select circuit.

And the read circuit 540 is composed of the same configuration (shown in FIG. 3), wherein the read circuit 540 includes the common pre-charge transistor 542 for pre-charging the common line 541 to the pre-charge voltage V0, the global pre-amp transistor 543 connecting to the global pre-amp node 544 for reading the common line 541, the global pre-set transistor 545 for pre-setting the global pre-amp node 544, a global middle-amp transistor 546 for reading to the global pre-amp node 544, a global main reset transistor 547 for resetting a global main-amp node which is connected to the global middle-amp transistor 546, and the global main-amp transistor 548 for reading the global main-amp node 544 when the global amp enable transistor 549 is enabled. And the global amp enable transistor 549 is connected to the left latch node 555 as a negative latch node.

And the latch circuit 550 includes a cross coupled inverter latch having inverters 553 and 554, a latch reset transistor 557 for resetting the right latch node 556 as a positive latch node, and a row write transistor pair 551 and 552 is connected to a column write transistor pair 551A and 552A which are controlled by a column control line pair 561 and 562 (in column direction). When writing data "1", the negative latch node 555 is pulled down by the series transistors 551 and 551A because a current path is set up by turning on the column write transistor 551A, while the row write transistor 551 is enabled by the row write signal 568A and the column control line 561 is asserted to high. But the other series transistors 552 and 552A are not set up a current path to the positive latch node 556 because the other column control line 562 keeps low, which turns off the other column write transistor 552A.

And the write circuit 534 receives an output from the cross coupled inverter latch for driving the common line 541, wherein the write circuit 534 includes an inverter having a pull-up transistor 535 and a pull-down transistor 536. And the pull-down transistor 536 is connected to the V0 voltage. And a source node of the pull-down transistor 536 is connected to a ground voltage for writing data "0", and a source node of the pull-up transistor 535 is connected to VDD voltage for writing data "1". A write enable transistor 537 receives an output of the inverter and drives the common line 541 during write operation.

For reading, a read data line 563 in column direction is connected to a read path including a read amplify transistor 558 which is enabled by a row read transistor 559A with a row read signal 569A and a column read transistor 559B with the column control line 561. When the memory block 500A is selected, a read data from selected memory block 500A reads a read data through the read path, but another memory block 500A' is not selected because another row read signal 569B keeps low even though the column control line 561 is common in the column direction. Similarly, a write data is not transferred to another memory block 500A' when the row write signal 568B is not asserted during write operation. In doing so, one of two columns is decoded by the row read signals and the row write signals.

Figure 5B:
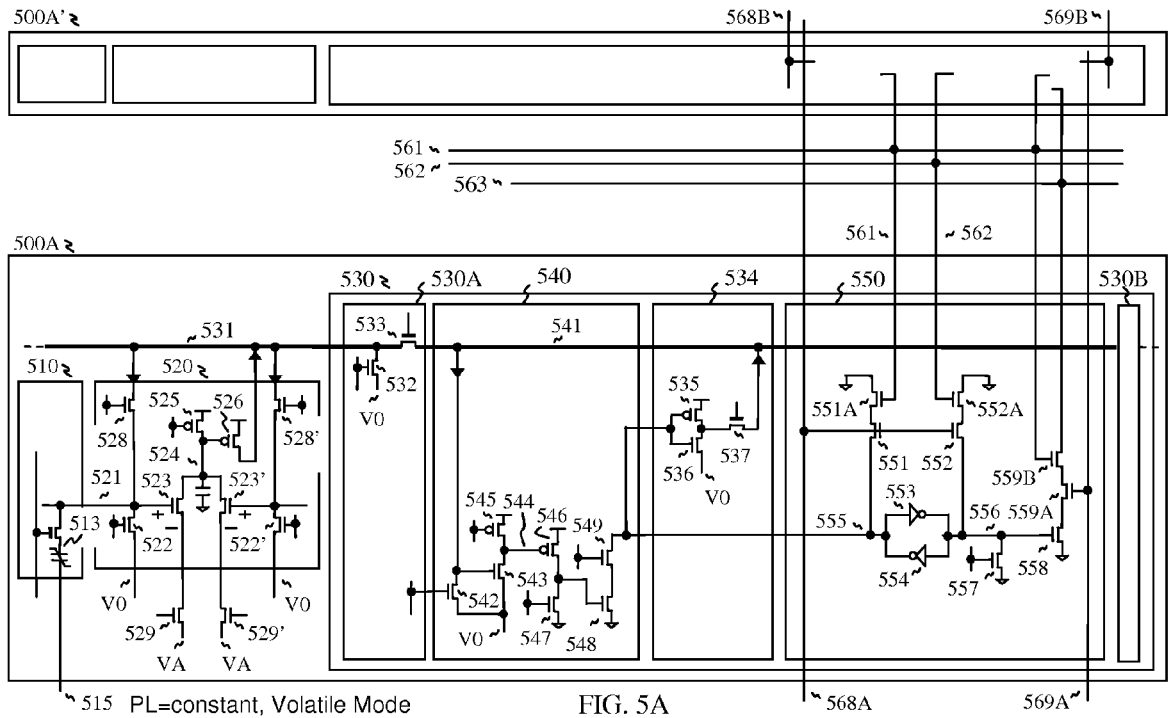
FIG. 5B illustrates simulated waveform when reading data "1"
Figure 5B:
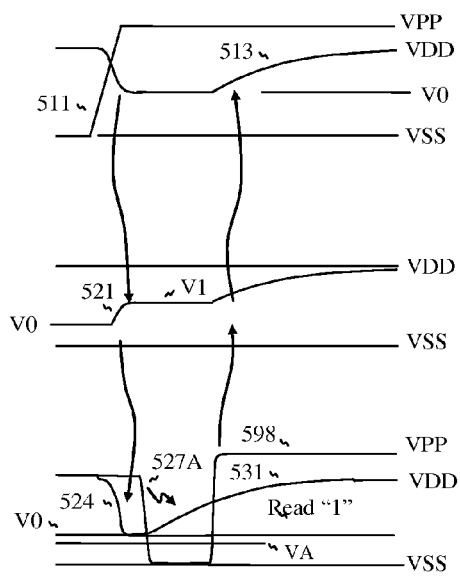

Referring now to FIG. 5B in view of FIG. 5A, simulated waveforms when reading data "1" with SPICE simulator are illustrated, wherein the word line (WL) 511 is asserted for selecting the memory cell 510, but the plate line is forced to a constant voltage source (not shown), such as the V0 voltage or VDD voltage for avoiding reverse polarization as a volatile memory application, which eliminates fatigue of the ferroelectric capacitor after long time use. Hence, the ferroelectric capacitor serves as a volatile storage element for storing charges, which works as a dynamic random access memory. When reading, the local bit line (LBL) 521 is raised to V1 voltage form V0 voltage, so that the local pre-amp node (PM1) 524 is lowered by the local pre-amp transistor 523. By lowering the local pre-amp node (PM1) 524, the local main-amp transistor 526 is turned on, which pulls up the global bit line (GBL) 531 connecting to the global sense amp 530. Hence the latch node (not shown) is flipped by pulling up the global bit line 531. At the same time, the write enable signal is generated by a delayed signal of the latched data, which is used for restoring the read data as the write back operation, as explained above.

Figure 5C:
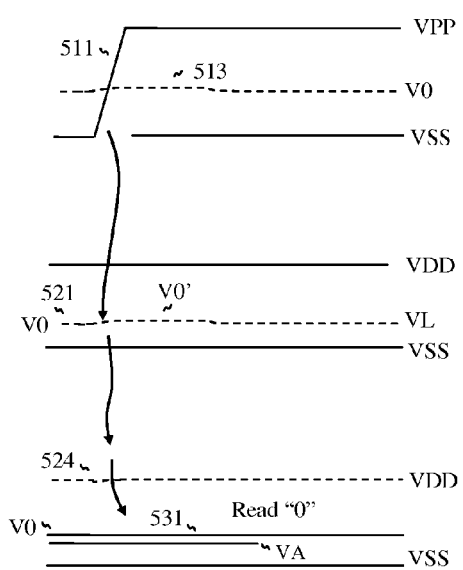
FIG. 5C illustrates simulated waveform when reading data "0" for the alternative memory segment, according to the teachings of the present invention.

Referring now to FIG. 5C in view of FIG. 5A, simulated waveforms when reading data "0" are illustrated, wherein the word line (WL) 511 is asserted for selecting the memory cell 510. After raising the word line, the local bit line (LBL) 521 is very slightly changed to V0 voltage, because the memory cell stores the V0 voltage for storing data "0" in the volatile mode as a DRAM (Dynamic Random Access Memory) operation. But, the local pre-amp node (PM1) 524 is not discharged. As a result, the global bit line (GBL) 531 keeps low, which does not pull down the latch node. Hence, the data output is not changed by the latch node. However, the write back operation is executed by the write enable signal which is generated by reading data "1" (as shown in FIG. 5B), where other operation is similar to that of FIG. 2A. Alternatively, volatile mode to nonvolatile mode can be switched by changing the plate line or not, as a prior art, U.S. Pat. No. 5,297,077.

Figure 6A:
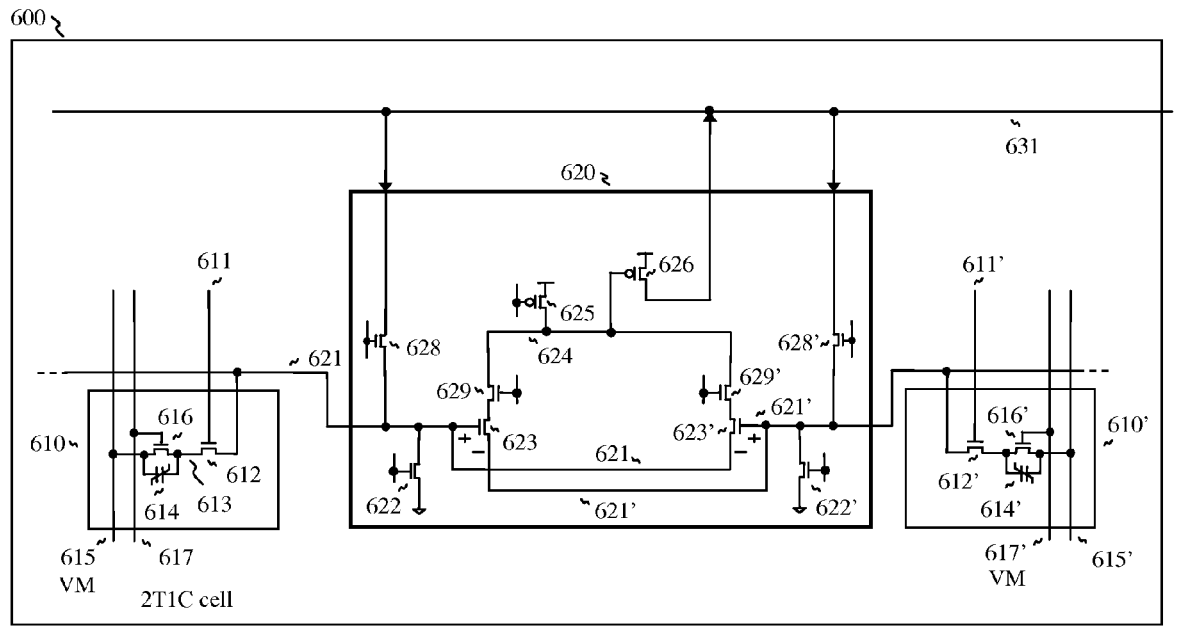
FIG. 6A illustrates an alternative memory segment for configuring 2T1C memory cell.

In FIG. 6A, an alternative memory segment 600 for replacing SRAM (Static Random Access Memory) with 2T1C cell is illustrated, wherein the plate line 615 is fixed at middle of VDD voltage (VM) for polarizing, when the storage node is forced to VDD voltage for polarizing and storing data "1" and VSS voltage for polarizing and storing data "0". And the storage node (SN) 613 is connected to a pre-charge transistor 616 connecting to a pre-charge control signal 617 for pre-charging the storage node to half VDD voltage during standby, such that the memory cell 610 includes the pass transistor 612, the pre-charge transistor 616 and the ferroelectric capacitor 614, where the pass transistor is connected to the word line 611. And another memory cell 610' is connected to the local sense amp 620 from right hand side, while the memory cell 610 is connected to the local sense amp 620 from left hand side. The memory cell 610' includes the pass transistor 612', the pre-charge transistor 616' and the ferroelectric capacitor 614', where the pass transistor is connected to the word line 611' and the plate line 615' is fixed at middle of VDD voltage (VM). And the memory cell 610 is connected to a local sense amp 620 through the left local bit line 621, and another memory cell 610' is through the right local bit line 621'.

For reading the 2T1C memory cell, the local sense amp is composed of ten transistors for comparing the left local bit line and the right local bit line as a comparator, and one of the local bit lines serves as a reference bit line, wherein the local sense amp 620 includes a left local reset transistor 622 for resetting the left local bit line 621, a left local amplify transistor 623 having a gate which is connected to the left local bit line 621 and a source which is connected to the right local bit line 621', a left local select transistor 629 serving as a selector for connecting the left local amplify transistor 623 to a local pre-amp node 624, a right local reset transistor 622' for resetting the right local bit line 621', a right local amplify transistor 623' having a gate which is connected to the right local bit line 621' and a source which is connected to the left local bit line 621, a right local select transistor 629' serving as a selector for connecting the right local amplify transistor 623' to the local pre-amp node 624, a local pre-set transistor 625 for connecting to the local pre-amp node 624, a local main-amp transistor 626 for reading the local pre-amp node 624, a left local write transfer gate 629 connecting to the left local bit line 621 for receiving the write data from the global bit line 631, and a right local write transfer gate 629' connecting to the right local bit line 621' for receiving the write data from the global bit line 631.

In this configuration, the reference local bit line is set up the local bit line voltage earlier than that of a reading bit line. For example, the right memory cell 610' as a reference memory cell quickly sets up the right local bit line 621' before the left memory cell as a main memory cell sets up the left local bit line 621, because the reference memory cell 610' is selected early without multi-stage decoding circuits, while the main memory cell 610 is selected slowly with many stages of decoding circuits in the main row decoder generally. Or the main decoding circuits can be intentionally delayed for activating the local sense amp with margin. Furthermore, the capacitance of the reference memory cell can be slightly smaller for lowering the reference bit line voltage when reading, which realizes to increase gain of the local sense amp as explained above, so that the local sense amp detects whether the main local bit line is higher than the reference local bit line for reading data "1", while data "0" is not read in this sensing scheme. And for wiring the local bit lines over the local main-amp transistor in a layout, one more metal layer may be added, which realizes flexible layout for the local sense amp.

Figures 6B, 6C:
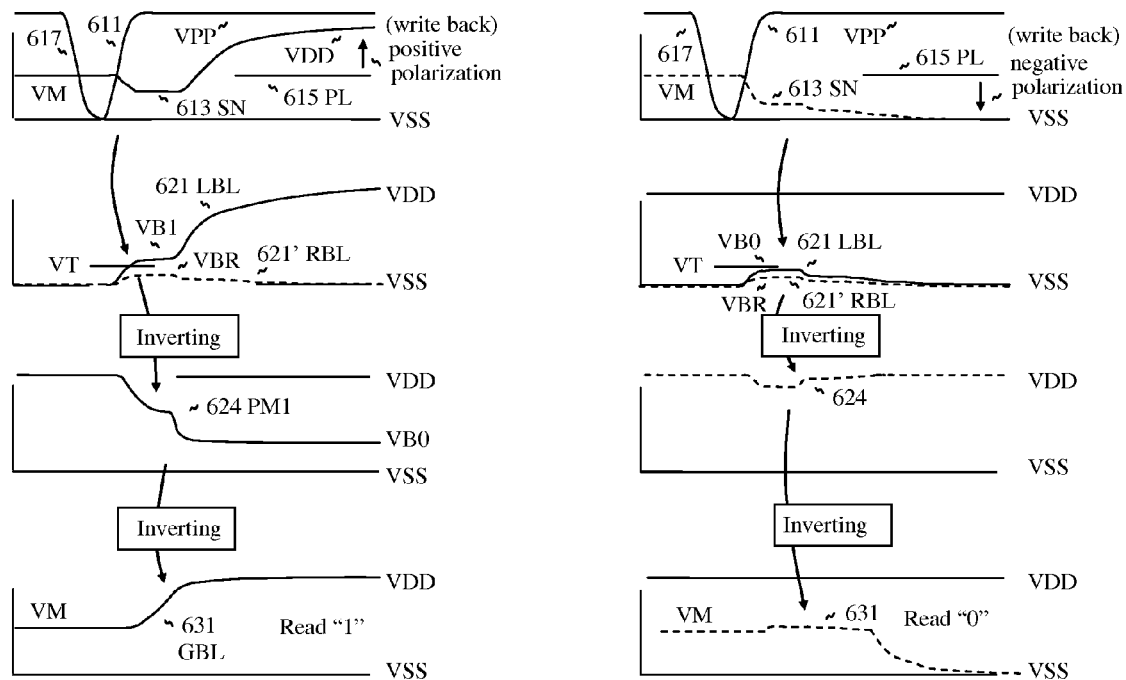
FIG. 6B illustrates simulated waveform when reading data "1"
FIG. 6C illustrates simulated waveform when reading data "0" for the alternative memory segment, according to the teachings of the present invention.

Referring now to FIG. 6B in view of FIG. 6A, simulated waveforms when reading data "1" with SPICE simulator are illustrated, wherein the pre-charge control lines 617 and 617' are de-asserted to low first, then the reference word line 611' is asserted for selecting the reference memory cell 610', and then the word line (WL) 611 is asserted to high for selecting the memory cell 610, but the plate line (PL) 615 is fixed at VM voltage. By asserting the reference word line 611', the reference local bit line (RBL) 621' is slight raised to a VBR voltage as a reference voltage. And by asserting the main word line 611, the left local bit line (LBL) 621 is raised to VB1 voltage from VSS voltage, because more charges in the storage node 613 (at VM) and less charges in the left local bit line 621 (at VSS) are re-distributed, so that the local pre-amp transistor 623 is turned on because voltage difference between the left local bit line 621 and the right local bit line 621' is higher than threshold voltage of the local pre-amp transistor 623 while the right reference memory cell 610' is smaller that that of main memory cell for setting the right local bit line to slightly lower voltage. Hence, the local pre-amp node (PM1) 624 is lowered by the local pre-amp transistor 623 while the left local select transistor 629 is turned on, but the right local select transistor 629' is turned off. By lowering the local pre-amp node (PM1) 624, the global bit line (GBL) 631 is raised to VDD voltage by the local main-amp transistor 626 while the local pre-set transistor 625 is turned off. And during write operation, the storage node 613 is fully charged to VDD voltage through the left local write transfer gate 628 for storing data "1", which polarizes the ferroelectric capacitor positively, while the plate line 615 is fixed at the VM voltage. And other operation for transferring data to the global sense amp is the same as above.

Referring now to FIG. 6C in view of FIG. 6A, simulated waveforms when reading data "0" are illustrated, wherein the reference word line (RWL) 611' and the word line (WL) 611 is asserted for selecting the memory cell 610, while the plate line (PL) 615 is fixed at the VM voltage. After the reference word line and the word line are asserted, the right local bit line (RBL) 621' is raised to the VBR voltage as the reference voltage, and the left local bit line (LBL) 621 is raised to VB0 voltage by little charges in the storage node 613, because the capacitance value of data "0" is much lower than that of data "1". Thus, the local amplify transistor 623 keeps turn-off state, and the local pre-amp node (PM1) 624 is not lowered by the local pre-amp transistor 623. As a result, the global bit line (GBL) 631 keeps low. And then the storage node 613 is fully discharged to VSS voltage through the left local write transfer gate 628 for storing data "0", which polarizes the ferroelectric capacitor negatively. And other operation is the same as above in FIG. 2A.

Furthermore, the ferroelectric capacitor memory cell can configure a series connection as a chain FRAM, as published, "High-Density Chain Ferroelectric Random Access Memory (Chain FRAM)", IEEE Journal of Solid-State Circuits, Vol. 33, No. 5, May 1998. And more prior arts are published, U.S. Pat. Nos. 6,552,922 and 6,664,158. However, conventional memory architecture uses heavy bit line, so that the ferroelectric capacitor should be big enough to charge and discharge the heavy bit line. On the contrary, in the present invention, the local bit line is lightly loaded, so that the lightly loaded bit line is driven by a series memory cell string including small memory cells. This means that the ferroelectric capacitor is reduced near the capacitance value of the local bit line. For example, the ferroelectric capacitor can be reduced to 5 fF only if the local bit line capacitance is reduced to 5 fF.

Figure 7:
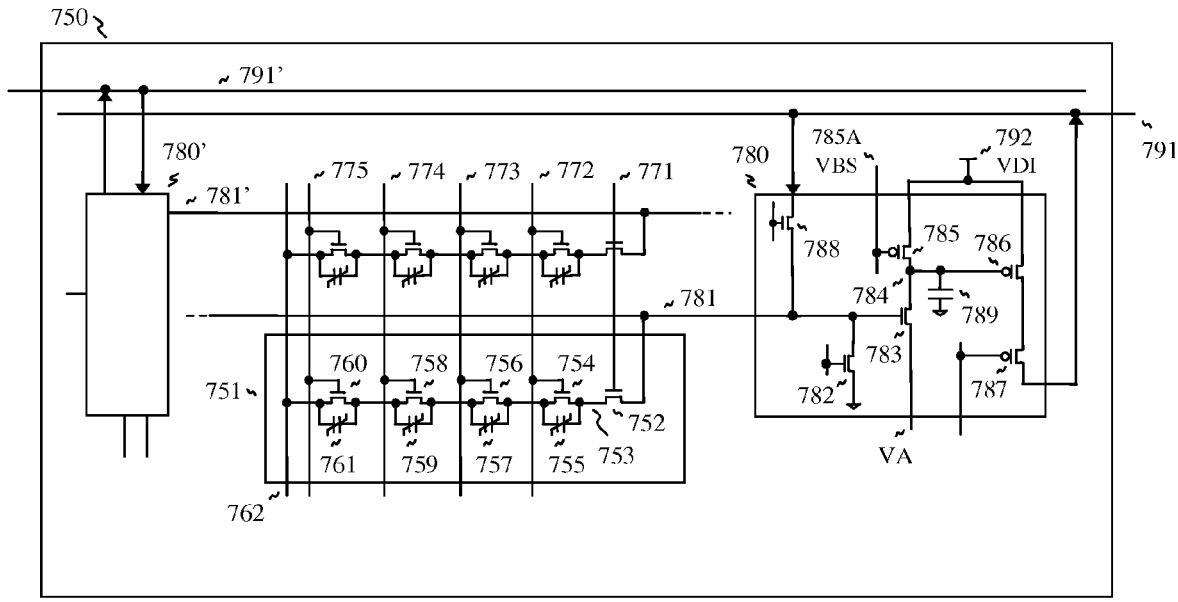
FIG. 7 illustrates an alternative configuration with series memory cells, according to the teachings of the present invention.

In FIG. 7, an alternative configuration with series memory cells is illustrated, wherein a series memory cell string 751 includes a string select transistor 752, a first memory cell including a first access transistor 754 and a first ferroelectric capacitor 755, a second memory cell including a second access transistor 756 and a second ferroelectric capacitor 757, a third memory cell including a third access transistor 758 and a third ferroelectric capacitor 759, and a fourth memory cell including a fourth access transistor 760 and a fourth ferroelectric capacitor 761. The string select transistor 752 is connected to the string select signal 771, the first access transistor 754 is connected to the first word line 772, the second access transistor 756 is connected to the second word line 773, the third access transistor 758 is connected to the third word line 774, the fourth access transistor 760 is connected to the fourth word line 775.

And the plate line 762 is fixed at half VDD voltage for polarizing when the storage node is forced to VDD voltage for polarizing and storing data "1" and VSS voltage for polarizing and storing data "0". The read and write operation are similar to those of FIG. 2A, such that the storage node 753 is pre-charged to half VDD voltage through the other access transistors during standby, because all access transistors are turned on. For reading the first memory cell 754, for example, the first access transistor 754 is turned off, while other access transistors 756, 758 and 760 keep turn-on state. Hence, capacitance value of the first ferroelectric capacitor is measured by turning on the string select transistor 752. For reading, the memory cell string is connected to a right local sense amp 780 through the local bit line 781, and another memory cell string is connected to a left local sense amp 780' through the local bit line 781'.

The right local sense amp 780 and the left local sense amp 780' are the same configuration, wherein the right local sense amp 780 includes a local reset transistor 782 for resetting the local bit line 781 to a ground voltage VSS, a local pre-amp transistor 783 connecting to a local pre-amp node 784 for discharging the local pre-amp node 784 when the local bit line 781 is raised to higher than the local amp voltage VA, in particular, a local active load transistor 785 for serving as an active load transistor to the local pre-amp transistor 783 where a bias voltage 785A is forced to the local active load transistor 785, a capacitor 789 for stabilizing the local pre-amp node 784, a local main-amp transistor 786 for reading to the local pre-amp node 784 when a local amp enable transistor 787 is enabled, and a local write transfer gate 788 is connected to the local bit line 781 for connecting to a global bit line 731, where a write enable signal 798 is connected to the local write transfer gate 788. And a source of the local pre-amp transistor 783 is connected to the local amp voltage VA for adjusting gain of a tunable common source amplifier configuration with the active load transistor, and the bias voltage 785A is generated by a bias voltage generator (as shown in FIG. 8E). For stabilizing the amplifier, the internal supply voltage (VDI) 792 is constant with an internal voltage generator with is controlled by a band gap voltage reference (not shown). By turning on the string select transistor 752, the voltage difference is exhibited in the local bit line 781, while the reset transistor 782 and the local write transfer gate 788 are turned off. And other operation is similar to that of FIG. 2A, for transferring the read output to the global line 791 and 791'.

In FIG. 8A, detailed tunable delay circuit (as shown 294 in FIG. 2A) is illustrated, wherein multiple delay units 801, 802 and 803 are connected in series, the first delay unit 801 receives input IN and generates output OUT, the second delay unit 802 is connected to the first delay unit, and the third delay unit 803 is connected to the second delay unit 802 and generates outputs 804 and 805, and so on. Each delay unit receives a fuse signal, such that the first delay unit receives F0, the second delay unit receives F1, and a third delay unit receives F2. And more detailed delay unit is illustrated in FIG.

8B, wherein the delay unit 810 receives an input IN0 and a fuse signal Fi, thus the fuse signal Fi selects output from the input IN0 or input DL1, so that a transfer gate 811 is turned on when the fuse signal Fi is low and output of inverter 813 is high, otherwise another transfer gate 812 is turned on when the fuse signal Fi is high and output of inverter 813 is low to bypass DL1 signal. Inverter chain 814 and 815 delays IN0 signal for the next delay unit, where more inverter chains or capacitors can be added for the delay even though the drawing illustrates only two inverters.

Figure 8C:
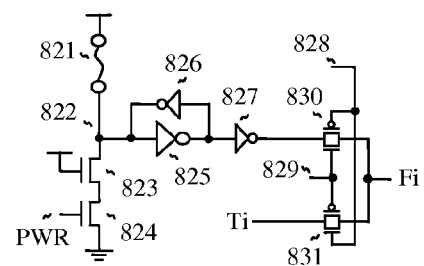
FIG. 8C illustrates a related fuse circuit for the tunable delay circuit.

In FIG. 8C, a related fuse circuit of the tunable delay circuit (as shown in FIG. 8A) is illustrated in order to store information for the delay circuit, so that a fuse serves as a nonvolatile memory, wherein a fuse 821 is connected to a latch node 822, a cross coupled latch including two inverters 825 and 826 are connected to the latch node 822, pull-down transistors 823 and 824 are serially connected to the latch node 822 for power-up reset. Transfer gate 830 is selected by a select signal 829 (high) and another select signal 828 (low) in order to bypass the latch node output 822 through inverter 825 and 827. In doing so, fuse data is transferred to output node Fi, otherwise test input Ti is transferred to Fi when a transmission gate 831 is turned on.

In FIG. 8D, a local amp voltage generator is illustrated for supplying the local amp voltage VA, wherein a reference voltage 855 is generated by a variable voltage reference circuit, such that a first resistor 852 is connected to a second resistor 853, the second resistor 853 is connected to a third resistor 854, and the third resistor 854 is connected to a fourth resistor 856, serially. Hence, the supply voltage VDD is reduced to the reference voltage output 855 by the ratio of the resistance value. And the reference voltage output 855 is tunable with turn-on or turn-off state of the transistors 850 and 851. In addition, the transistors are controlled by control signals Fa and Fb, respectively. And the control signals Fa and Fb are generated by the fuse circuit as shown in FIG. 8C, where turn-on resistance of the transistor is much smaller than the resistance value of the resistor. And the reference voltage 855 is buffered by an op amp 858, so that the variable voltage VA is generated by the op amp 858 and a big driver transistor 859. Generally, a voltage difference between two op amp inputs 855 and 857 is equal or very close. In doing so, the variable voltage output VA is almost equal to the reference voltage 855. And a weak current sink transistor 861 is connected to the VA voltage output 857 for stabilizing the output, wherein the current sink transistor 861 is controlled by a bias voltage Vbias. And, the global amp voltage VG is generated with similar configuration, wherein the voltage VG is set up slightly higher with the fuse circuit (shown in FIG. 8C). Thus the global amp voltage generator is not drawn in the present invention.

In FIG. 8E, a bias voltage generator is illustrated for generating a bias voltage VBS 878 which is forced to the common source amplifier of the local sense amp (shown 780 in FIG. 7), wherein the bias voltage generator is composed of a reference current generating portion and a voltage driving portion. The reference current generating portion is composed of a pull-up PMOS transistor 872, resistors 873 and 874, and a pull-down NMOS transistor 875, where the resistors can be selected or not by turning on tuning transistors 870 and 871 respectively with fuse outputs Fc and Fd from fuse circuits (shown in FIG. 8C). Thus, a current flow through the pull-down transistor 875 is regulated by selecting the resistors, and the current flow is repeated by the current repeat transistor 876. Hence, the voltage driving portion is composed of the current repeat transistor 876 and a drive transistor 877 for driving the bias voltage signal 878.

Referring now to FIG. 9A in view of FIG. 3, example layout for the local sense amp 920 is illustrated, wherein the local sense amp 920 includes poly gate 922 as the left local reset transistor, poly gate 923 as the left local amplify transistor, poly gate 928N as the left local write transfer NMOS gate, poly gate 928P as the left local write transfer PMOS gate, poly gate 922' as the right local reset transistor, poly gate 923' as the right local amplify transistor, poly gate 925' as the right local write transfer NMOS gate, poly gate 928P' as the right local write transfer PMOS gate. And the local pre-set transistor 925 is connected to the local pre-amp node 924 for pre-setting to the supply voltage VDD, and the local main-amp transistor 926 is connected to the local pre-amp node 924 for reading to the read output and transferring to the global bit line 931. The left local amplify transistor 923 is connected to the left local pull-down transistor through a common pull-down node 923A. NMOS transistors are composed of n+ active region on p-well region (PW), and PMOS transistors are composed of p+ active region on n-well region (NW). Contact regions (CT) are formed on the active regions and poly regions for connecting to metal-1 region. In FIG. 9B, metal-1 (M1) region and via-1 region are defined, such that metal-1 region 921 serves as the left local bit line. And in FIG. 9C, metal-2 (M2) region and via-2 are defined. In FIG. 9D, metal-3 (M3) region is defined as the global bit line 931 for connecting to the left local write transfer gates 928N and 928P, the right local write transfer gates 928N' and 928P', the left local amplify transistor 923, and the right local amplify transistor 923'.

In FIG. 9E, an equivalent circuit of the local sense amp 920 is illustrated, wherein the local sense amp 920 includes the left local reset transistor 922 for resetting the left local bit line 921, the left local amplify transistor 923 for reading the left memory cell 910 through the left local bit line 921, the left local write transfer gates 928N and 928P for connecting the left local bit line 921 to the global bit line 931, the right local reset transistor 922' for resetting the right local bit line 921' to ground voltage, the right local amplify transistor 923' for reading the right memory cell through the right local bit line 921', the right local write transfer gates 928N' and 928P' for connecting the right local bit line 921' to the global bit line 931, the local pre-set transistor 925 for pre-setting to the local pre-amp node 924, the local main-amp transistor 926 for reading the local pre-amp node 924 and transferring to the global bit line 931, wherein the left local amplify transistor 923 is connected to the left local pull-down transistor 929 and the global bit line 931, and the right local amplify transistor 923' is connected to the right local pull-down transistor 929' and the global bit line 931. In the figure, node numbers are the same as FIGS. 9A to 9D for ease of understanding.

Referring now to FIG. 9F in view of FIG. 4C, example layout for the 6-transistor local sense amp 970 is illustrated, wherein the local sense amp 970 includes poly gate 972 as the left local reset transistor, poly gate 973 as the left local amplify transistor, poly gate 975 as the left local write transistor, poly gate 972' as the right local reset transistor, poly gate 973' as the right local amplify transistor, and poly gate 975' as the right local write transistor. The left local amplify transistor 973 is connected to the left local pull-down transistor through a common pull-down node 973A. The transistors are composed of n+ active region on p-well region (PW). In FIG. 9G, metal-1 (M1) region and via-1 region are defined, such that metal-1 region 971 serves as the left local bit line. And in FIG. 9H, metal-2 (M2) region and via-2 are defined. In FIG. 9I, metal-3 (M3) region is defined as the global bit line 981 for connecting to the left local write transistor 975, the right local write transistor 975', the left local amplify transistor 973, and the right local amplify transistor 973'.

In FIG. 9J, an equivalent circuit of the local sense amp 970 is illustrated, wherein the local sense amp 970 includes the left local reset transistor 972 for resetting the left local bit line 971, the left local amplify transistor 973 for reading the left memory cell 910 through the left local bit line 971, the left local write transistor 975 connecting to the left local bit line 971 and the global bit line 981, the right local reset transistor 972' for resetting the right local bit line 971' to ground voltage, the right local amplify transistor 973' for reading the right memory cell through the right local bit line 971', and the right local write transistor 975' connecting to the right local bit line 971' and the global bit line 981, wherein the left local amplify transistor 973 is connected to the left local pull-down transistor 979 and the global bit line 981, and the right local amplify transistor 973' is connected to the right local pull-down transistor 979' and the global bit line 981.

The left and the right local write transistors can be composed of thick oxide transistor for transferring the global bit line voltage without threshold voltage drop, so that gate voltage of the write transistors are forced to higher voltage than others, alternatively. And the other transistors are also composed of thick oxide transistors, and additionally low threshold implant is added for the left local amplify transistor 973 and the right local amplify transistor 973' for enhancing read operation as an alternative configuration. In the figure, node numbers are the same as FIGS. 9F to 9I for ease of understanding.

In FIGS. 10A, 10B, 10C and 10D, an example layout for configuring an open bit line memory cell array is illustrated. A solid line 1000 depicts a memory cell. In the process steps, the active region 1001 is formed first, and gate oxide (not shown) is formed on the active region, then gate poly 1002 is formed on the gate oxide region. After then capacitor contact region 1003 is formed as shown in FIG. 10A. Then, a storage node 1004 is formed on the capacitor contact region 1003 as shown in FIG. 10B. After forming the storage node (bottom plate) 1004, an insulation layer (not shown) is formed on the storage node 1004. Then, a capacitor plate (top plate) 1005 is formed on the storage node 1004 as shown in FIG. 10C. After then, contact region 1006 is formed. In FIG. 10D, a first metal layer 1007 for the local bit line is formed on the contact region 1006 (in FIG. 10C). And a second metal layer 1008 for the global word line is formed on the first metal layer 1007, as shown in FIG. 10D. In this open bit line structure, one word line is used to control a memory cell with no passing word line, which makes a straight word line in shape. Hence, the open bit line structure occupies 6F.sup.2 in general while F is minimum feature size for fabrication, which reduces chip area. Furthermore, half of row decoders are reduced with no passing word line, which reduces chip area as well.

Figure 10E:
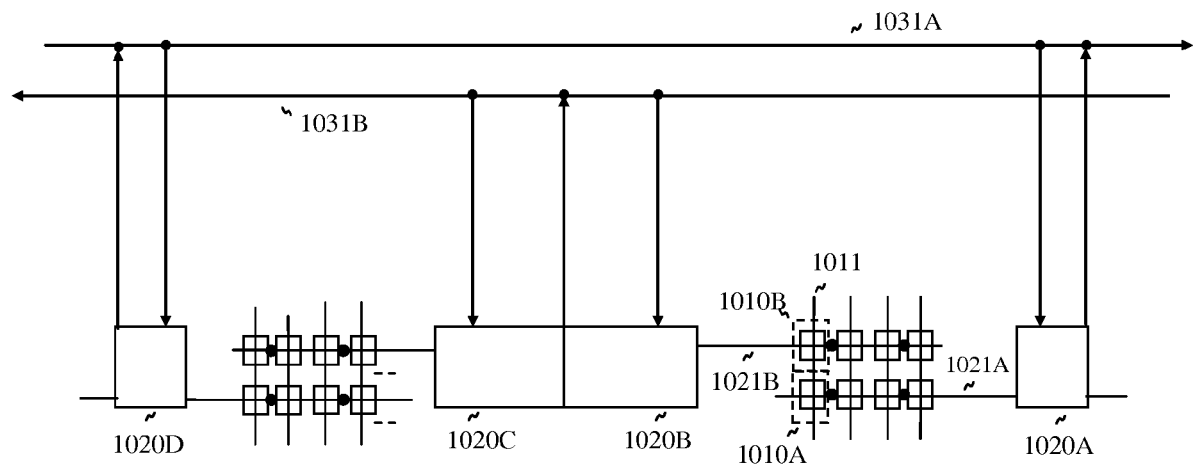
FIG. 10E illustrates a block diagram for implementing the open bit line architecture, according to the teachings of the present invention.

More detailed array configuration is illustrated in FIG. 10E, wherein a memory cell 1010A is connected to the local bit line 1021A which is connected to the local sense amp 1020A to read the memory cell with a word line 1012, and the global bit line 1041A is connected to the local bit line 1017 through write transfer transistor (not shown) of the local sense amp 1020A. And other memory cell 1010B is connected to the local bit line 1021B which is connected to the local sense amp 1020B to read data with the same word line 1012. When reading data, the word line 1012 is asserted to a predetermined voltage. Thus, the read output from the memory cell 1010A is transferred to the local sense amp 1020A connecting to the global bit line 1031A, and another read output from the memory cell 1010B is transferred to the local sense amp 1020B connecting to the global bit line 1031B, while other local sense amps 1020C and 1020D are not activated. The output is transferred to block sense amp (not shown) through the global bit line 1031A for the memory cell 1110A and another global bit line 1031B for the memory cell 1010B.

Methods of Fabrication

The memory cells can be formed from single crystal silicon as the conventional FRAM cell. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors: An Efficient and Low-Cost Option for Digital Operation", IEEE Transactions on Electron Devices, Vol. 54, No. 11, November, 2007, and "A Novel Blocking Technology for Improving the Short-Channel Effects in Polycrystalline Silicon TFT Devices", IEEE Transactions on Electron Devices, Vol. 54, No. 12, December, 2007. During LTPS process, the MOS transistor in the control circuit and routing metal are not degraded. And the steps in the process flow should be compatible with the current CMOS manufacturing environment as published, U.S. Pat. Nos. 5,990,507, 5,638,319, 6,075,264, and 6,967,365 for forming FRAM memory cell. And forming the thin film transistor is similar to TFT (thin film transistor) SRAM, as published, U.S. Pat. Nos. 6,670,642 and 6,828,689. In this respect, detailed manufacturing processes for forming the memory cell, such as width, length, thickness, temperature, forming method, or any other material related data, are not described in the present invention.

Figure 11A:
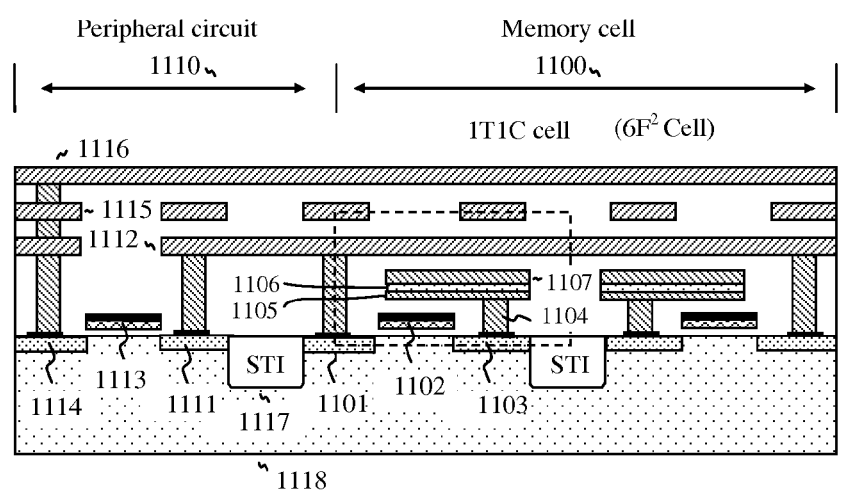
FIG. 11A illustrates an example cross sectional view of the 1T1C memory cell for implementing the nonvolatile ferroelectric random access memory or volatile dynamic random access memory.

In FIG. 11A, an example cross sectional view of the memory cell (shown 210 in FIG. 2A) is illustrated, wherein memory cell 1100 is composed of the pass transistor having a drain 1101, a gate 1102 and a source 1103, and the capacitor having bottom plate 1105 and top plate 1107 on ferroelectric material 1106, such as, PZT (lead zirconate titanate). And the capacitor is connected to the source 1103 of the gate 1102 through a contact region 1104. And the local bit line 1112 is connected to the drain 1101 of the pass gate 1102, where the local bit line 1112 is composed of metal-1 layer. And the local bit line 1112 is connected to the local write transfer gate 1113 through a drain region 1111 as an example connection, where the local write transfer gate 1113 is connected to the global bit line 1116 through a source region 1114 and metal layers including metal-1 and metal-2 region 1115. And the global bit line 1116 is composed of metal-3 layer. The peripheral circuit region 1110 is placed on the same surface of a substrate 1118, where the memory cell region 1100 is isolated by STI (Shallow Trench Isolation) region 1117. And various ferroelectric capacitors can be used as the storage capacitor, such as lead zirconate titanate (PZT), lead lanthanum zirconium titanate (PLZT), barium strontium titanate (BST), and strontium bismuth tantalate (SBT).

Figure 11B:
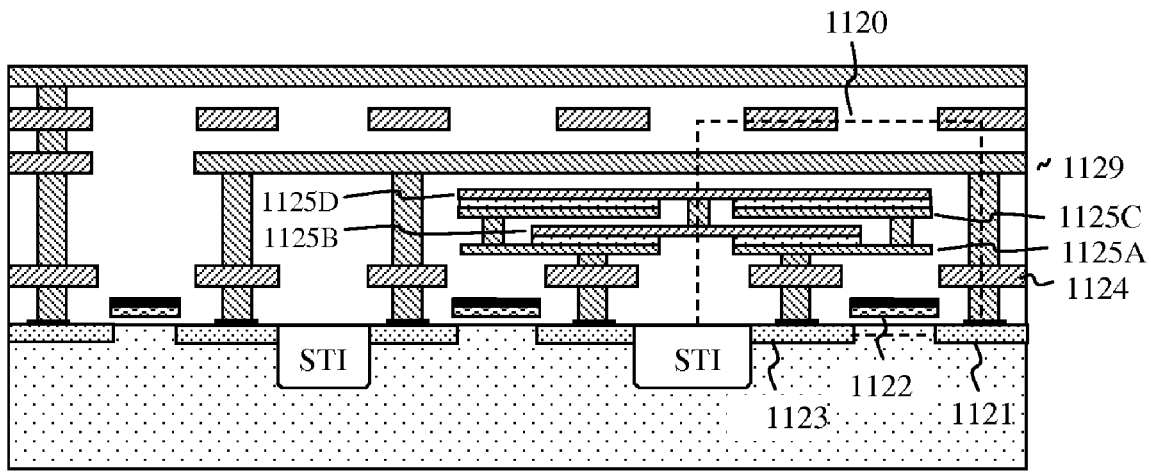
FIG. 11B and FIG. 11C illustrate alternative cross sectional views.

In FIG. 11B, an alternative memory cell structure for increasing capacitance value with fingered shape capacitor is illustrated, wherein the memory cell 1120 is composed of the pass transistor including gate 1122, drain/source 1121 and 1123, and the capacitor including fingered shape plates 1125A, 1125B, 1125C and 1125D. The plates 1125A and 1125B configure a first capacitor, and the plates 1125C and 1125D configure a second capacitor. In particular, the two fingered capacitors are formed in between a first routing layer 1124 and a second routing layer 1129 serving as the local bit line, which increases capacitance value in a given area. And for forming the ferroelectric capacitor on the metal-1 line 1124, ferroelectric materials can be deposited at low temperature as a prior art, "Low-Temperature Capacitor-Over-Interconnect (COI) Modular FeRAM for SOC Application", IEEE Transaction on Electron Devices, Vol. 51, No. 6, June 2004.

Figure 11C:
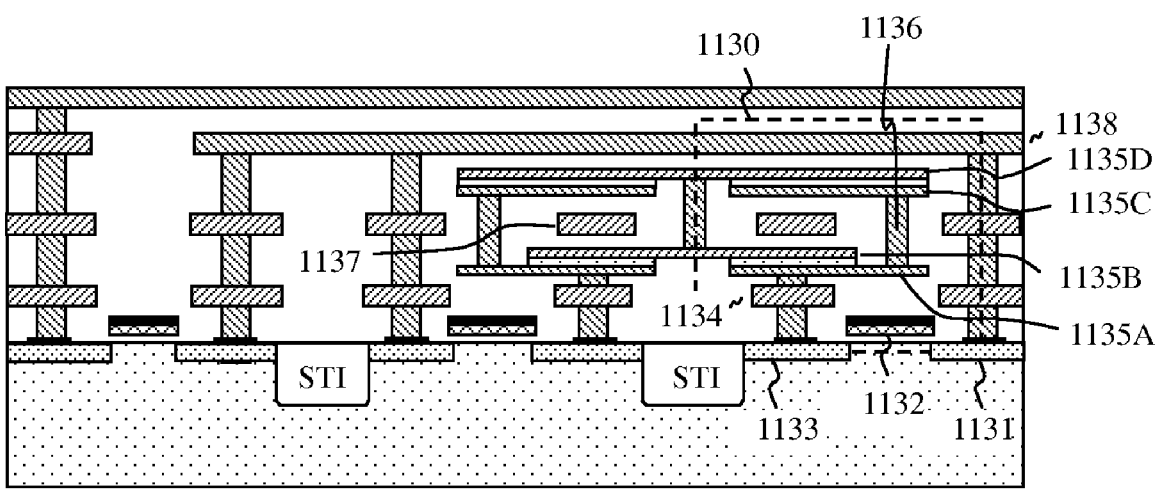

In FIG. 11C, an alternative memory cell structure including separated capacitors is illustrated, wherein the memory cell 1130 is composed of the pass transistor including gate 1132, drain/source 1131 and 1133, and the capacitor including fingered shape plates 1135A, 1135B, 1135C and 1135D. In particular, a routing layer 1137 serving a main word line is passing between the bottom capacitor and the top capacitor, such that the bottom capacitor is composed of plates 1135A and 1135B, and the top capacitor is composed of plates 1135C and 1135D. Hence, contact depth between each metal layer is reduced for connecting the capacitor to the source region 1133 through a metal-1 region 1134.

Figure 11D:
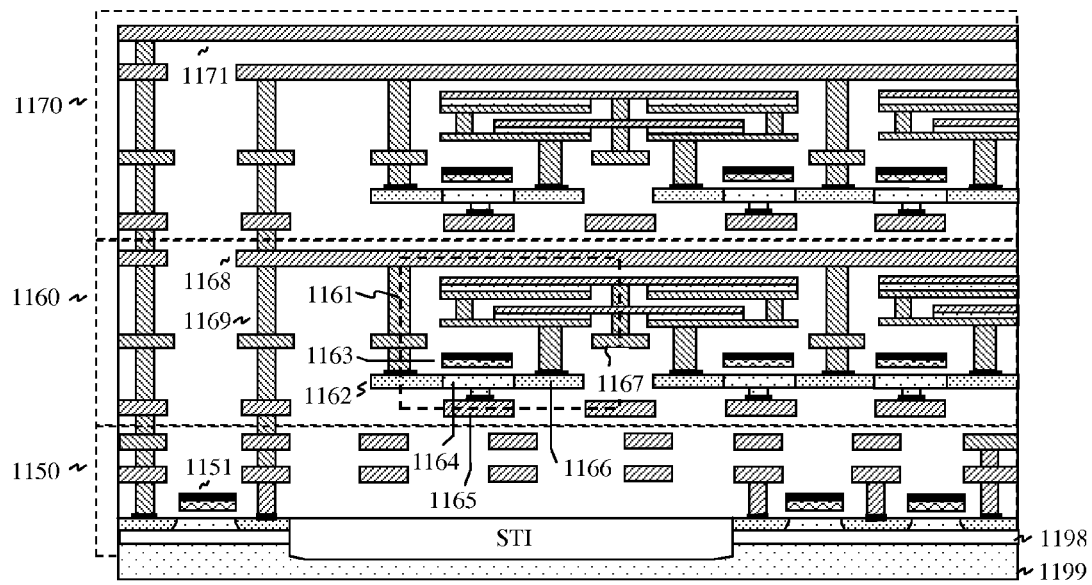
FIG. 11D illustrates a stacked configuration with thin film transistor, according to the teachings of the present invention.

In FIG. 11D, stacked memory cell structure is illustrated as an example, wherein memory cells in a second floor 1160 are formed on the control circuits 1150 in a first floor, and memory cells in a third floor 1170 are formed on the second floor. The memory cells are connected to local bit line including metal region 1168 and contact region 1169, and the local bit line is connected to a local write transfer gate 1151, for example. And the local write transfer gate 1151 is connected to the global bit line. The plate line 1167 is connected to the capacitor. The memory cell 1161 is composed of the pass transistor 1163 including drain/source regions 1162 and 1166, and a body region 1164. In particular, the body region 1164 is connected to a metal bias line 1165 from the bottom. As shown in the figure, the memory cells include thin film transistor as the pass transistor with body-tied structure for biasing the body, so that the bias voltage is provided in order to reduce sub-threshold leakage current for NMOS pass transistor. And the memory cells have same characteristics as long as same material and thickness are used. And the transistors in the first floor are formed on SOI (Silicon on Insulator) wafer as an alternative configuration, wherein the BOX (Buried Oxide) layer 1198 is formed on the substrate 1199. Furthermore, thin film layer is formed from silicon, silicon-germanium and germanium.

Figure 12A:
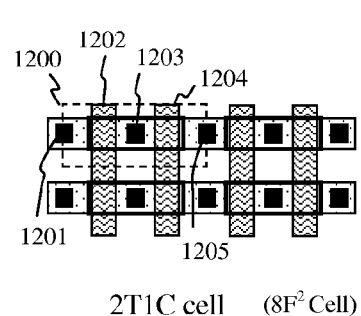
FIG. 12A illustrates an example top view of the 2T1C memory cell.

In FIG. 12A, an example top view of the 2T1C memory cell (shown 610 in FIG. 6A) is illustrated, wherein a broken line 1200 shows the 2T1C memory cell, poly gate 1202 serves as the pass transistor, and poly gate 1204 serves as the pre-charge transistor. Contact region 1201 is connected to the local bit line, another contact region 1203 is connected to the storage node, and contact region 1205 is connected to half VDD voltage. The 2T1C memory cell occupies 8F.sup.2, so that area is slightly increased, but operation speed is dramatically reduced with fixed plate line.

Figure 12B:
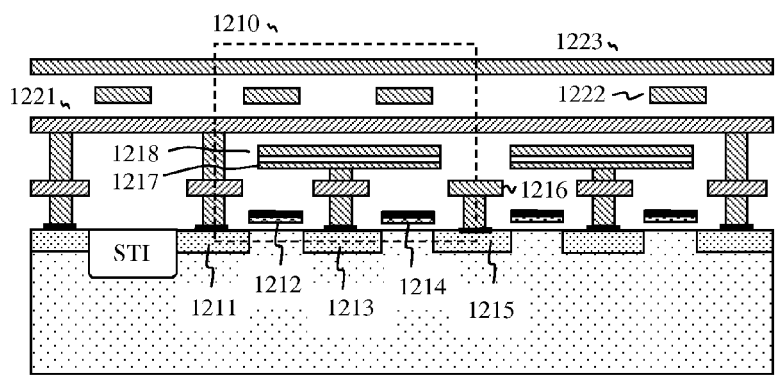
FIG. 12B illustrates a cross sectional view of a planar configuration.

Referring now to FIG. 12B in view of FIG. 12A, the cross sectional view of the 2T1C memory cell is illustrated, wherein memory cell 1210 is composed of the pass transistor having a drain 1211, a gate 1212 and a source 1213, the capacitor having bottom plate 1217 and top plate 1218, and the pre-charge transistor having a drain 1213 (source of the pass transistor as well), a gate 1214 serving as the pre-charge transistor, and a source 1215. And the capacitor is connected to the source 1213 of the pass gate 1212 through contact region and metal-1 region. The source of the pre-charge transistor 1214 is connected to the metal-1 region 1216 (forcing half VDD voltage). And the local bit line 1221 is connected to the drain 1211 of the pass gate 1212 through the metal-1 and metal-2 region, where the local bit line 1221 is composed of metal-2 layer. And the global bit line 1223 is composed of metal-4 layer while a main word line 1222 is composed of metal-3 layer.

In FIG. 12C, an example top view of the series memory cells (shown 751 in FIG. 7) is illustrated, wherein the series memory cell 1240 includes string select transistor 1232 and 1248, and four series memory cells including a memory cell 1240 which is selected by a word line 1241. The series memory cell occupies 4F.sup.2, so that area is dramatically reduced.

Figure 12D:
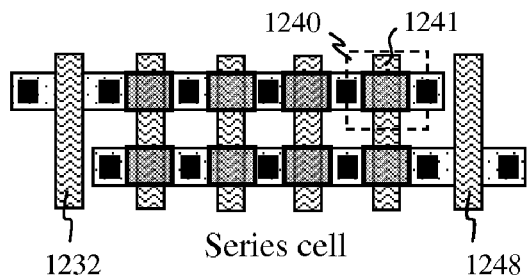
FIG. 12D illustrates a cross sectional view of a planar configuration.
Figure 12D:
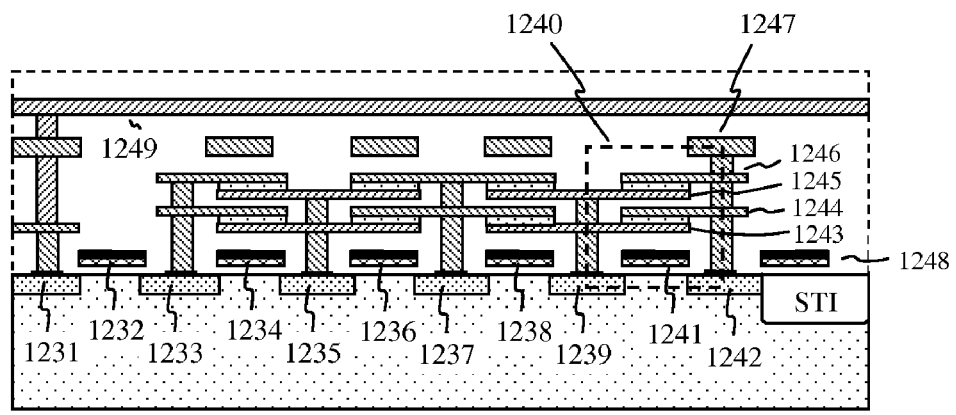

Referring now to FIG. 12D in view of FIG. 12C, the cross sectional view of the series memory cells is illustrated, wherein the series memory cell 1230 is composed of the string select transistor 1232 having a drain 1231 and a source 1233, a first memory cell having a drain 1233 (the source of the string select transistor), a gate 1234 and a source 1235, a second memory cell having a drain 1235 (the source of the gate 1234), a gate 1236 and a source 1237, a third memory cell having a drain 1237 (the source of the gate 1236), a gate 1238 and a source 1239, a fourth memory cell 1240 having a drain 1239 (the source of the gate 1238), a gate 1241 and a source 1242. The source 1242 of the fourth memory cell is connected to metal-2 layer 1247 which is forced to half VDD voltage. The memory cell 1240 is composed of the word line 1241 and the capacitor including multiple plates which forms fingered shape, wherein the plates 1243 and 1244 are connected to the pass transistor, and the plates 1245 and 1246 are connected to the plate line 1247. And the (metal-3) local bit line 1249 is connected to the drain 1231 of the string select transistor 1232. The passing gate 1248 is used for selecting the next memory string (as shown in FIG. 12C).

Figure 12E:
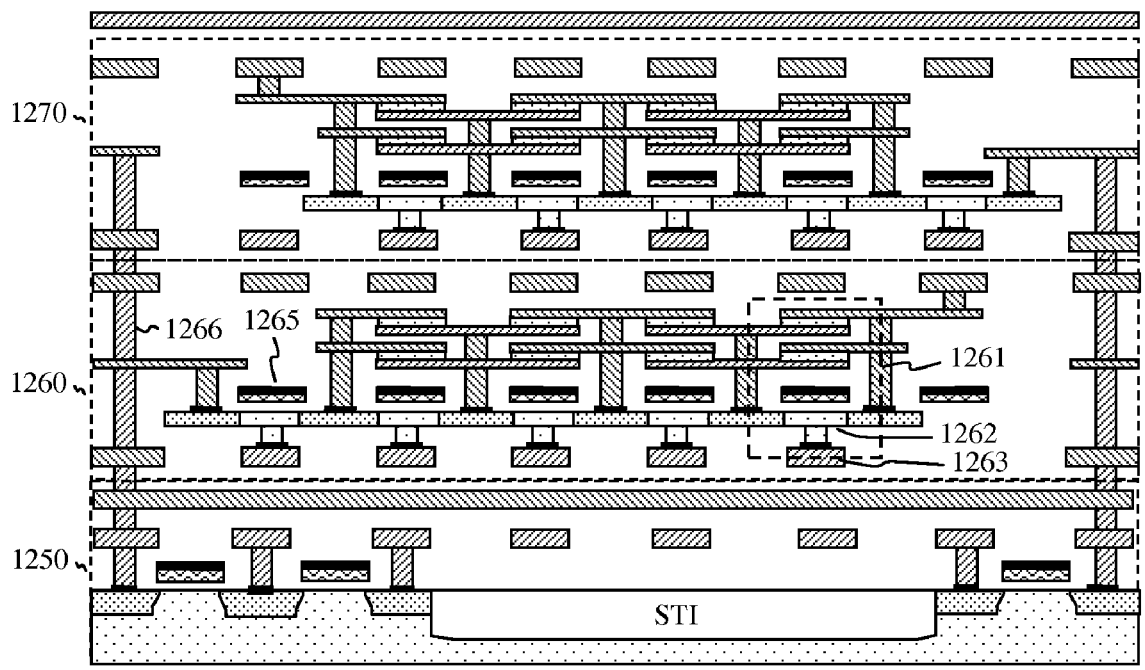
FIG. 12E illustrates a stacked configuration with thin film transistor for the series memory cells, according to the teachings of the present invention.

In FIG. 12E, stacked memory cell structure for the series memory cells is illustrated as an example, wherein memory cell 1261 in the second floor 1260 is formed on the control circuits 1250, and memory cells in third floor 1270 are formed on the second floor, wherein the memory cell 1261 is composed of same structure as the memory cell 1240 in FIG. 12C, except thin film pass transistor serving as the pass transistor. The thin film transistor configures a body-tied structure for biasing the body, so that self-heating problem is alleviated by forcing a bias voltage to the body 1262 through bias line 1263. The ferroelectric capacitor is formed at low temperature as explained above. And the local bit line 1266 connected to the series memory cells through the string select transistor 1265.

While the descriptions here have been given for configuring the memory circuit and structure, alternative embodiments would work equally well with PMOS pass transistor, such that the PMOS transistor can be used for configuring the memory cell, and signal polarities are reversed to control the PMOS pass transistor configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
a memory cell connecting to a local bit line, wherein the memory cell is composed of a pass transistor connecting to the local bit line and a storage node, and a ferroelectric capacitor connecting to the storage node and a plate line, for configuring a ferroelectric random access memory;
a tunable gain amp serving as a local sense amp, wherein the tunable gain amp includes a local reset transistor for resetting the local bit line, a local pre-amp transistor whose source is connected to a local amp voltage for tuning gain and whose gate is connected to the local bit line for reading the memory cell, a local pre-set transistor for pre-setting a local pre-amp node which is connected to a drain of the local pre-amp transistor, a local main-amp transistor for reading the local pre-amp node, a local amp enable transistor connecting to the local main-amp transistor serially for enabling, and a local transfer gate for transferring a write data from a global bit line to the local bit line;
a global sense amp connecting to the global bit line, wherein the global sense amp includes a read circuit, a latch circuit, a write circuit, and at least a select circuit, such that the read circuit reads the global bit line through the select circuit when reading, the latch circuit receives and stores an output from the read circuit or a pair of write data buses, and the write circuit receives an output from the latch circuit and drives the global bit line through the select circuit when writing;
a local amp voltage generator for generating the local amp voltage which is tunable;
a delay circuit as a locking signal generator for generating a delayed signal which disables a global amp enable transistor of the read circuit when reading, wherein the delayed signal is generated by an output from the latch circuit.

2. The memory device of claim 1, wherein the local sense amp includes sharing portions, such that the local sense amp includes a left local reset transistor for resetting a left local bit line, a left local pre-amp transistor for reading a left memory cell through the left local bit line, a right local reset transistor for resetting a right local bit line, a right local pre-amp transistor for reading a right memory cell through the right local bit line, a local pre-set transistor connecting to the left local pre-amp transistor and the right local pre-amp transistor through a local pre-amp node, a local main-amp transistor for reading the pre-amp node, a left local transfer gate for transferring the write data from the global bit line to the left local bit line, and a right local transfer gate for transferring the write data from the global bit line to the right local bit line, where the sharing portions are the local pre-set transistor and the local main-amp transistor.

3. The memory device of claim 1, wherein the local sense amp includes a shared local amp enable transistor, such that the local sense amp is composed of a left local reset transistor for resetting a left local bit line, a left local amplify transistor for reading a left memory cell through the left local bit line, a right local reset transistor for resetting a right local bit line, a right local amplify transistor for reading a right memory cell through the right local bit line, the shared local amp enable transistor whose drain is connected to a common node for connecting to the left local amplify transistor and the right local amplify, and whose source is connected to the global bit line, a left local transfer gate for connecting the left local bit line to the global bit line, and a right local transfer gate for connecting the right local bit line to the global bit line.

4. The memory device of claim 1, wherein the local sense amp is composed of a left local reset transistor for resetting a left local bit line, a left local amplify transistor for reading a left memory cell through the left local bit line, a right local reset transistor for resetting a right local bit line, a right local amplify transistor for reading a right memory cell through the right local bit line, a left local transfer gate for connecting the left local bit line to the global bit line, and a right local transfer gate for connecting the right local bit line to the global bit line, where the left local amplify transistor and the right local amplify transistor are connected to the global bit line.

5. The memory device of claim 1, wherein the local sense amp is composed of a comparator for comparing a left local bit line and a right local bit line, such that the local sense amp includes a left local reset transistor for resetting the left local bit line, a left local amplify transistor having a gate which is connected to the left local bit line and a source which is connected to the right local bit line, a left local select transistor serving as a selector for connecting the left local amplify transistor to a local pre-amp node, a right local reset transistor for resetting the right local bit line, a right local amplify transistor having a gate which is connected to the right local bit line and a source which is connected to the left local bit line, a right local select transistor serving as a selector for connecting the right local amplify transistor to the local pre-amp node, a local pre-set transistor for pre-setting the local pre-amp node, a local main-amp transistor for reading the local pre-amp node, a left local transfer gate for connecting the left local bit line to the global bit line, and a right local transfer gate for connecting the right local bit line to the global bit line.

6. The memory device of claim 1, wherein the global sense amp is connected to the global bit line, such that the global sense amp includes a read circuit, a latch circuit, and a write circuit without a select circuit, where the read circuit reads the global bit line, the latch circuit receives and stores an output from the read circuit or the pair of write data buses, the write circuit receives an output from the latch circuit and drives the global bit line when writing.

7. The memory device of claim 1, wherein the write circuit includes an inverter connecting to one of latch nodes of the latch circuit, and a global write enable switch receiving an output of the inverter.

8. The memory device of claim 1, wherein the latch circuit includes a cross coupled inverter latch connecting to a pair of latch nodes, a latch reset transistor for resetting one of the latch nodes, and a pair of series transistors having a row select transistor pair for connecting to the pair of the latch nodes and a column select transistor pair for connecting to a pair of data lines.

9. The memory device of claim 1, wherein the latch circuit includes a cross coupled inverter latch connecting to a pair of latch nodes, a latch reset transistor for resetting one of the latch nodes, a pair of write transistors for connecting to a pair of write data lines, and a read amplify transistor for reading one of the latch nodes, when a column read transistor is enabled.

10. The memory device of claim 1, wherein the latch circuit includes a cross coupled inverter latch connecting to a pair of latch nodes, a latch reset transistor for resetting one of the latch nodes, a pair of write series transistors having a row write transistor pair for connecting to the pair of the latch nodes and a column write transistor pair for connecting to a pair of data lines, a read amplify transistor for reading one of the latch nodes, and a row read transistor and a column read transistor are serially connected to the read amplify transistor for reading.

11. The memory device of claim 1, wherein the latch circuit is connected to a write data line pair and a read data line, such that the write data line pair is connected to a data write circuit including an inverting write tri-state inverter and a non-inverting write tri-state inverter for driving the write data line pair, and a pair of pre-charge transistors for pre-charging the write data line pair.

12. The memory device of claim 1, wherein the local amp voltage generator generates the local amp voltage, such that fuse circuits are used for setting the local amp voltage.

13. The memory device of claim 1, wherein the delay circuit includes tunable delay elements for adjusting delay time.

14. The memory device of claim 1, wherein the plate line of the memory cell is connected to a constant voltage source.

15. The memory device of claim 1, wherein the memory cell is composed of an access transistor connecting to a storage node, a ferroelectric capacitor connecting to the storage node, and a pre-charge transistor connecting to the storage node for configuring 2T1C (two transistor and one capacitor) memory cell.

16. The memory device of claim 1, wherein the memory cell configures a series connection for increasing density, such that the series connection is composed of a first memory cell having a first access transistor and a first ferroelectric capacitor, a second memory cell having a second access transistor and a second ferroelectric capacitor, a third memory cell having a third access transistor and a third ferroelectric capacitor, and a fourth memory cell having a fourth access transistor and a fourth ferroelectric capacitor; and the series connection is connected to the local bit line through a string select transistor; alternatively, more memory cells are serially connected to the series connection for increasing density further.

17. The memory device of claim 1, wherein the pass transistor of the memory cell is formed various materials, such as, single crystalline silicon, poly crystalline silicon, silicon-germanium and germanium.

18. The memory device of claim 1, wherein the ferroelectric capacitor of the memory cell is composed of a fingered shape capacitor.

19. The memory device of claim 1, wherein the ferroelectric capacitor of the memory cell is composed of various ferroelectric materials for configuring non-volatile memory, such as lead zirconate titanate (PZT), lead lanthanum zirconium titanate (PLZT), barium strontium titanate (BST), and strontium bismuth tantalate (SBT).

20. The memory device of claim 1, wherein the memory cell is stacked over another memory cell.

* * * * *